US012206338B2

(12) United States Patent
Sato et al.

(10) Patent No.: US 12,206,338 B2
(45) Date of Patent: *Jan. 21, 2025

(54) ELECTRIC DRIVE WITH ARC SHAPED BUSBAR CONNECTED TO TERMINAL OF SMOOTHING CAPACITOR

(71) Applicants: Mazda Motor Corporation, Hiroshima (JP); Rohm Co., Ltd., Kyoto (JP)

(72) Inventors: Takayuki Sato, Aki-gun (JP); Masashi Hayashiguchi, Kyoto (JP)

(73) Assignees: MAZDA MOTOR CORPORATION, Hiroshima (JP); ROHM CO., LTD., Kyoto (JP)

( * ) Notice: Subject to any disclaimer, the term of this patent is extended or adjusted under 35 U.S.C. 154(b) by 230 days.

This patent is subject to a terminal disclaimer.

(21) Appl. No.: 17/971,395

(22) Filed: Oct. 21, 2022

(65) Prior Publication Data

US 2023/0136386 A1    May 4, 2023

(30) Foreign Application Priority Data

Oct. 29, 2021   (JP) .................................. 2021-178236

(51) Int. Cl.
| | |
|---|---|
| *H02M 7/537* | (2006.01) |
| *B60L 50/51* | (2019.01) |
| *H02M 7/00* | (2006.01) |
| *H02K 19/02* | (2006.01) |
| *H05K 7/20* | (2006.01) |

(52) U.S. Cl.
CPC ............ *H02M 7/537* (2013.01); *B60L 50/51* (2019.02); *H02M 7/003* (2013.01); *B60L 2210/40* (2013.01); *B60L 2220/50* (2013.01); *H02K 19/02* (2013.01); *H05K 7/20927* (2013.01)

(58) Field of Classification Search
CPC ... H02M 7/003; H02M 7/537; B60L 2210/40; B60L 50/51; H05K 7/20927
See application file for complete search history.

(56) References Cited

U.S. PATENT DOCUMENTS

| | | |
|---|---|---|
| 2010/0327709 A1 | 12/2010 | Minato et al. |
| 2011/0189035 A1 | 8/2011 | Nakagami et al. |
| 2013/0278090 A1 | 10/2013 | Matsuo |

(Continued)

FOREIGN PATENT DOCUMENTS

| | | |
|---|---|---|
| CN | 106602798 A | 4/2017 |
| DE | 102015219476 A1 | 12/2016 |

(Continued)

*Primary Examiner* — Harry R Behm
(74) *Attorney, Agent, or Firm* — Alleman Hall & Tuttle LLP

(57) ABSTRACT

An inverter is disposed adjacent to one end of a motor in a rotational axis direction. The inverter includes a plurality of power modules each including a switching element, a smoothing capacitor, busbars that connect the power modules to the smoothing capacitor, and a thin case that accommodates these components. The plurality of power modules are disposed at the periphery of the smoothing capacitor and arranged in the circumferential direction. The busbars are formed to extend in the circumferential direction. An inner edge portion of each of the busbars connected to a terminal of the smoothing capacitor has an arc shape or a circular shape.

20 Claims, 17 Drawing Sheets

(56) References Cited

U.S. PATENT DOCUMENTS

| | | | | |
|---|---|---|---|---|
| 2015/0001972 | A1* | 1/2015 | Miyama | H02K 9/00 |
| | | | | 310/52 |
| 2016/0013706 | A1* | 1/2016 | Mukunoki | H02K 11/026 |
| | | | | 310/68 D |
| 2017/0305456 | A1* | 10/2017 | Iwabuki | H02P 6/10 |
| 2022/0302792 | A1 | 9/2022 | Jiang et al. | |
| 2023/0138904 | A1* | 5/2023 | Sato | H02K 11/33 |
| | | | | 310/71 |
| 2023/0421075 | A1* | 12/2023 | Mishra | H02M 7/5387 |
| 2024/0014714 | A1* | 1/2024 | Sato | H02K 9/19 |

FOREIGN PATENT DOCUMENTS

| | | |
|---|---|---|
| JP | 2004274992 A | 9/2004 |
| JP | 5517650 B2 | 6/2014 |
| JP | 2016019346 A | 2/2016 |
| WO | 2012096335 A1 | 7/2012 |
| WO | 2014171023 A1 | 10/2014 |
| WO | 2020107891 A1 | 6/2020 |
| WO | 2021109843 A1 | 6/2021 |

* cited by examiner

ELECTRIC DRIVE WITH ARC SHAPED BUSBAR CONNECTED TO TERMINAL OF SMOOTHING CAPACITOR

BACKGROUND OF THE INVENTION

1. Field of the Invention

The disclosed technology relates to an onboard electric drive unit including a motor and an inverter.

2. Description of the Related Art

In recent years, vehicles configured to travel by using electricity, such as hybrid vehicles and electric vehicles, have become remarkably popular. A vehicle of this type is equipped with a drive motor and a battery. Direct-current power supplied from the battery is converted into alternating-current power by the inverter. The alternating-current power is controlled and supplied to the drive motor. Rotational power that is thereby generated is used by the vehicle to travel.

An inverter of this type handles high electric power. Thus, a large voltage is applied thereto, and large current flows therein. Accordingly, a large amount of heat is generated during operation, and cooling is required. A large surge voltage is also generated. Therefore, the sizes of individual electronic components constituting the inverter are large, and the weights thereof tend to be heavy. Accordingly, inverters known in the art are a factor that hinders an improvement in fuel consumption and electricity consumption.

An inverter is usually disposed near a drive motor to shorten a power transmission distance. In a vehicle, however, a large number of devices are installed and a space for disposing an inverter is limited. It is also necessary to consider the balance of the vehicle body. It is thus difficult to dispose a large and heavy inverter in a vehicle appropriately.

To address such an issue, a technology that integrates an inverter with a motor to reduce the size and the weight of the inverter has been proposed (for example, Japanese Unexamined Patent Application Publication No. 2004-274992).

In Japanese Unexamined Patent Application Publication No. 2004-274992, coolability of a switching element by air-cooling is improved by devising the structure of an inverter case.

SUMMARY OF THE INVENTION

An inverter includes a smoothing capacitor, a power module including a switching element, and the like. As described above, when the inverter is compatible with high-voltage power sources, these electronic components are generally large and heavy.

Large current also flows through a metal part (busbar), which is an electronic component connecting these components. The metal part is thus also large and heavy. When the wiring length (corresponding to a distance over which current flows) of the busbar increases, electric resistance increases accordingly, and a copper loss is generated during energization. The busbar also generates a large amount of heat. Moreover, since large current is turned on and off at a high speed by switching control in the inverter, a large change in magnetic field is generated in the busbar accordingly.

Consequently, when the inverter is operated, noise, vibration, electromagnetic interference, and the like may be generated in the busbar due to the changing magnetic field. These effects may lead to an energy loss and may adversely affect the performance of the vehicle. Accordingly, countermeasures are required. When the busbar has a complex shape, the effect thereof is more noticeable.

In the inverter disclosed in Japanese Unexamined Patent Application Publication No. 2004-274992, although it may be possible to achieve a size reduction by integrating the inverter with the motor, the electronic components are the same as those known in the art. Accordingly, there is room for improvement in, for example, the structures and arrangement of the electronic components.

Thus, the disclosed technology achieves an electric drive unit in which the size and the weight can be reduced while performance can be improved by devising the structures, arrangement, and the like of main electronic components that constitute an inverter.

The disclosed technology relates to an electric drive unit including a motor and an inverter disposed adjacent to one end of the motor in a rotational axis direction.

The inverter includes a plurality of power modules each of which includes at least one switching element, the plurality of power modules constituting an inverter circuit configured to convert direct-current power into alternating-current power; a smoothing capacitor that constitutes, together with the plurality of power modules, the inverter circuit; a busbar that connects each of the power modules to the smoothing capacitor; and a thin case that has a thickness of less than 50 mm in the rotational axis direction and that accommodates the power modules, the smoothing capacitor, and the busbar.

The plurality of power modules are disposed at the periphery of the smoothing capacitor and arranged in the circumferential direction. The busbar is formed to extend in the circumferential direction. An inner edge portion of the busbar connected to a terminal of the smoothing capacitor has an arc shape or a circular shape extending in the circumferential direction.

According to this electric drive unit, the inverter includes the thin case having a thickness of less than 50 mm in the rotational axis direction and is disposed adjacent to one end of the motor in the rotational axis direction. It is thus possible to achieve size and weight reductions of the electric drive unit.

It is necessary to connect the motor and the inverter to each other by a plurality of busbars (output-side busbars) while it is possible to shorten the wiring lengths thereof and reduce the inductances of the output-side busbars by disposing the inverter to be adjacent to one end of the motor in the rotational axis direction. In addition, since the motor and the inverter are disposed coaxially, it is possible to make the wiring lengths of the output-side busbars more uniform by disposing the output-side busbars in accordance with the motor. It is thus possible to equalize the inductances of the output-side busbars and possible to improve the controllability of the motor.

In this electric drive unit, the shapes and the arrangement of the power modules, the smoothing capacitor, and the busbar, which are main electronic components constituting the inverter circuit, are devised to enable these electronic components to be accommodated in the above-described thin case, which has difficulty in accommodating those with technology known in the art.

That is, the plurality of power modules are disposed at the periphery of the smoothing capacitor. It is thus possible to efficiently dispose these electronic components and possible to reduce the installation space.

Since the busbar connecting these electronic components is formed to extend in the circumferential direction in accordance with the space between these electronic components, the busbar has a shape having a width larger than a length required for connecting these electronic components. Therefore, it is possible to reduce the wiring length of the busbar and increase the width of the busbar orthogonal to the wiring length. Consequently, it is possible to reduce the inductance of the busbar effectively. Since the busbar has a large surface area and improved heat dissipation properties, it is possible to improve the performance of the electric drive unit.

Since the inner edge portion of the busbar connected to the terminal of the smoothing capacitor has the arc shape or the circular shape extending in the circumferential direction, the shortest length from a terminal of each of the power modules arranged in the circumferential direction to the inner edge portion can be substantially the same at any part. Therefore, it is possible to make the wiring lengths of the power modules more uniform by connecting the inner edge portion to the smoothing capacitor. Consequently, it is possible to equalize the inductance between each power module and the smoothing capacitor and thus possible to improve the controllability of the motor.

The electric drive unit may be configured such that the thin case has an outer shape formed in a disk shape corresponding to the motor.

In this case, it is possible to achieve the electric drive unit that has a small size and that is lightweight. Flexibility in vehicle design is greatly increased, and it is possible to achieve a high-performance vehicle. The electric drive unit is also suitable for an in-wheel motor.

The electric drive unit may be configured such that the smoothing capacitor and the power modules each have a flat shape having an installation surface at one side and are placed on a common support surface via the installation surface.

When the smoothing capacitor and the power modules each have a flat shape and are placed on a common support surface via respective installation surfaces provided at one side thereof, the thickness of the inverter can be further reduced. Since all of these electronic components are arranged on the common support surface, it is possible to minimize the height from the support surface. Accordingly, even the thin case having a small thickness in the rotational axis direction can accommodate these electronic components.

Since the flat shape increases the area, these electronic components are excellent in heat dissipation. Therefore, it is possible to effectively cool these electronic components, which generate a large amount of heat during operation, and possible to improve the performance of the electric drive unit.

The electric drive unit may be configured such that the busbar includes a third busbar that has a plate shape extending in a fan shape along an upper surface of each of the power modules, and that the third busbar is connected to one of a positive electrode terminal and a negative electrode terminal of each of the power modules and to a corresponding terminal of the smoothing capacitor.

Due to having the plate shape extending in the fan shape in accordance with the arrangement of the plurality of power modules, the third busbar has a large surface area and excellent heat dissipation properties. Moreover, since the third busbar extends along the upper surface of each of the power modules, it is possible to efficiently cool the power modules. In addition, the third busbar has a large lateral width and thus has a low inductance. Due to the plate shape, it is possible to accelerate size and weight reductions of the inverter.

The electric drive unit may be configured such that the busbar includes a first busbar that has a plate shape extending in a band shape between and along each of the power modules and the smoothing capacitor and that is connected to another of the positive electrode terminal and the negative electrode terminal of each of the power modules and to a corresponding terminal of the smoothing capacitor.

That is, in the electric drive unit, in addition to the third busbar, the first busbar connected to the positive electrode terminal or the negative electrode terminal that is not connected to the third busbar has the plate shape extending in the band shape between and along each of the power modules and the smoothing capacitor.

Therefore, the first busbar has a short wiring length and a large busbar width orthogonal to the wiring length. Consequently, it is possible to effectively reduce the inductance of the first busbar. Due to the plate shape, it is possible to accelerate size and weight reductions of the inverter.

The electric drive unit may be configured such that each of the power modules includes the positive electrode terminal and the negative electrode terminal, a half bridge circuit, and an output terminal, the at least one switching element being two switching elements, the half bridge circuit being connected between the positive electrode terminal and the negative electrode terminal in a state in which the two switching elements are connected in series, the output terminal being connected between the two switching elements.

In this case, a plurality of circuits provided in accordance with the phases of the motor in the inverter circuit can be configured by incorporating each of these power modules. As a result, layout design of the electronic components in the inner portion of the inverter is facilitated. The size reduction of the inverter can be accelerated.

The electric drive unit may be configured such that the switching element is constituted by a silicon carbide metal oxide semiconductor field effect transistor.

The SiC MOSFET has low electric resistance and excellent heat resistance compared with an insulated gate bipolar transistor (IGBT) and a power metal oxide semiconductor field effect transistor (MOSFET), which are generally used as switching elements of this type. Consequently, the chip size of the SiC MOSFET can be reduced more than the IGBT and the power MOSFET having the same performance.

Accordingly, it is possible to reduce the size of the electronic component incorporating the switching element. In particular, since the two switching elements are incorporated in series in each power module described above, the size can be more effectively reduced.

The electric drive unit may be configured such that the smoothing capacitor is constituted by a plurality of element capacitors connected in parallel, and that the plurality of element capacitors that are arranged to face the plurality of power modules are disposed along the arrangement of the plurality of power modules.

To be compatible with high voltages, the smoothing capacitor is required to have a large capacity. Meanwhile, in this electric drive unit, the number of the element capacitors is selectable in accordance with a desired capacity, which increases flexibility in design. Moreover, the outer shape of the smoothing capacitor can be freely set by changing the arrangement of these element capacitors. When these element capacitors are disposed laterally, a thickness reduction of the inverter can be accelerated.

Further, when the plurality of element capacitors arranged to face the plurality of power modules are disposed along the arrangement of the plurality of power modules, the distance between these element capacitors and each of the power modules can be shortened, which can accelerate reduction and equalization of the inductance.

According to the electric drive unit to which the disclosed technology is applied, size and weight reductions can be achieved while performance is improved. Therefore, when the electric drive unit is mounted on a vehicle, fuel consumption and electricity consumption can be improved, and flexibility in vehicle design is increased. Noise and the like can be also suppressed, and thus, a high-performance vehicle can be achieved.

DESCRIPTION OF THE PREFERRED EMBODIMENTS

Hereinafter, the disclosed technology will be described using a plurality of preferable embodiments. Fundamentally, the following description is merely exemplary. The matters described in each embodiment are not limited to the embodiment and are applicable also to the other embodiments.

An electric drive unit in which the disclosed technology is used is suitable for power sources of vehicles such as hybrid vehicles and electric vehicles that travel using electricity. Accordingly, an onboard electric drive unit is presented as an example in the following embodiments.

Figure 1:
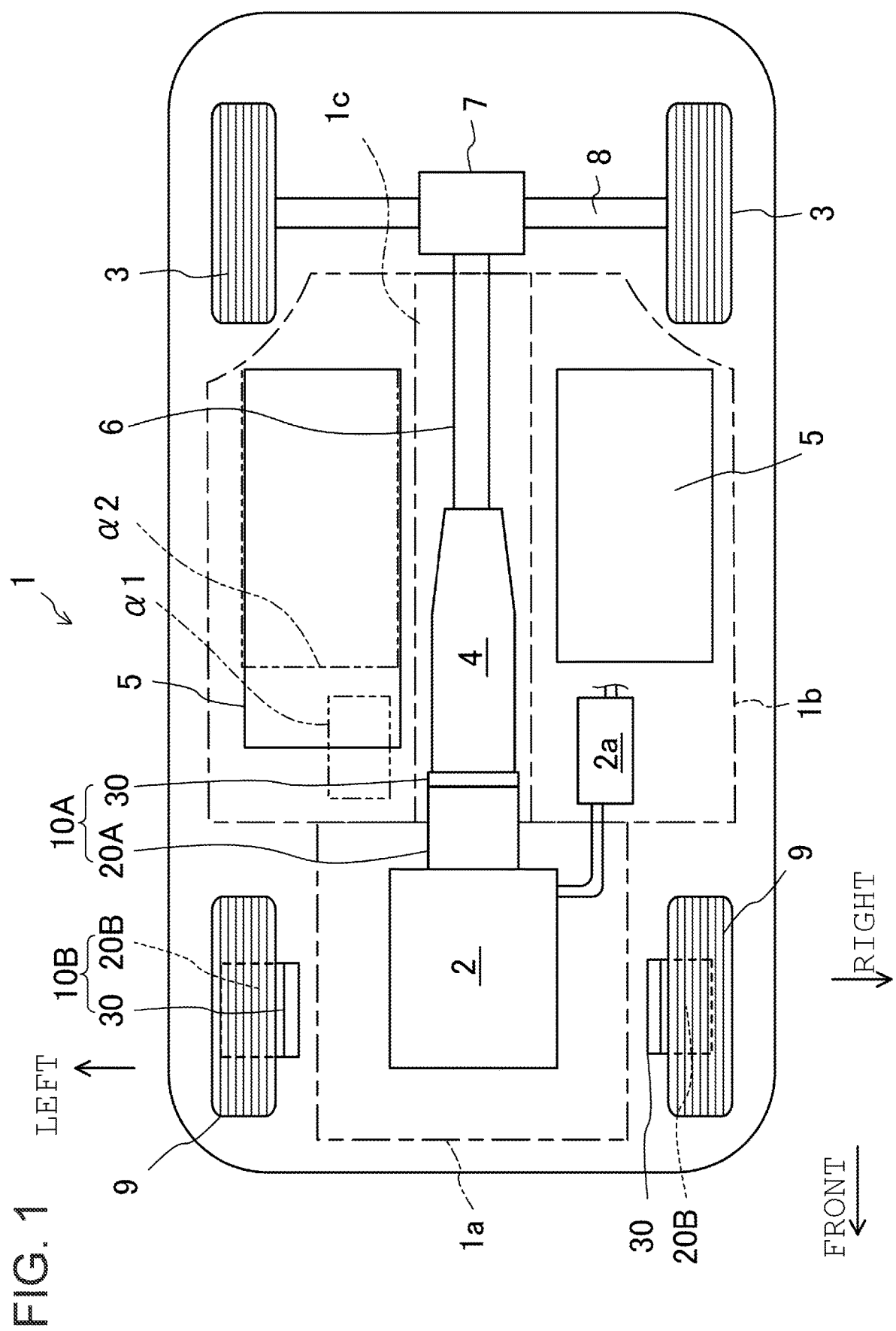
FIG. 1 is one example of a vehicle to which a disclosed electric drive unit is applied.

FIG. 1 is a schematic view in which a vehicle 1 according to the present embodiment is viewed from below. The vehicle 1 is a so-called hybrid vehicle. As main driving sources, an engine 2 and a drive motor 20A (one example of the disclosed motor) are mounted. The disclosed technology is applicable not only to a hybrid vehicle but also to an electric vehicle that travels with only a motor.

In the vehicle 1, an engine room 1a is disposed at a front side of the vehicle interior. The engine 2 is disposed in the engine room 1a. Rear wheels 3 are driving wheels. That is, the vehicle 1 is a so-called front-engine rear-drive (FR) vehicle.

The vehicle 1 is also equipped with, in addition to the engine 2 and the drive motor 20A described above, first and second inverters 30, an automatic transmission 4, a high-voltage battery 5, a propeller shaft 6, a differential 7, and the like, as drive system devices. The drive motor 20A is integrated (constitutes the disclosed electric drive unit) with the first inverter 30. The drive motor 20A and the first inverter 30 (first electric drive unit 10A) integrated with each other are disposed adjacent to the rear side of the engine 2.

Figure 2:
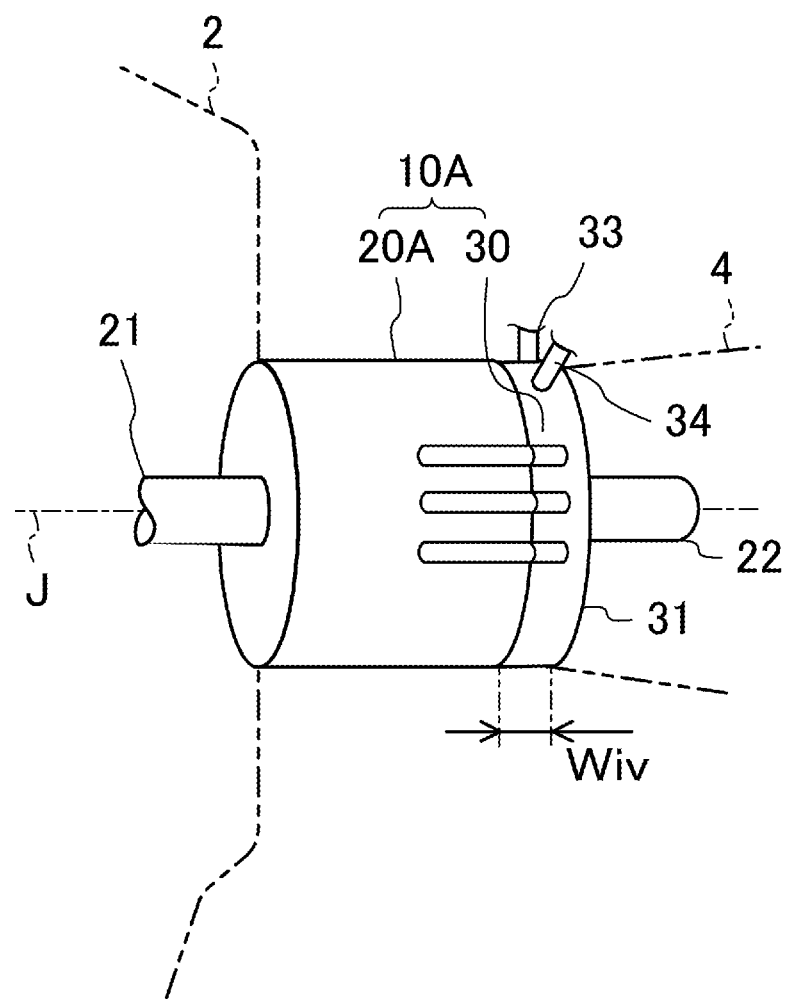
FIG. 2 is a view roughly illustrating a first electric drive unit mounted on the vehicle.

As illustrated in FIG. 2, the drive motor 20A has a front shaft 21 projecting from the front end thereof, and a rear shaft 22 projecting from the rear end thereof. Although not illustrated, the front shaft 21 is coupled to the output shaft (crankshaft) of the engine 2 via a clutch and the like. The rear shaft 22 is coupled to the automatic transmission 4.

As illustrated in FIG. 1, a central part in the vehicle width direction of a floor panel 1b constituting the floor surface of the vehicle interior is provided with a floor tunnel 1c projecting toward the vehicle interior side and extending in the front-rear direction. In a state of being accommodated in the floor tunnel 1c, the automatic transmission 4 is disposed adjacent to the rear side of the first electric drive unit 10A. A front end portion of the propeller shaft 6 is coupled to the rear side of the automatic transmission 4.

A rear end portion of the propeller shaft 6 is coupled to the differential 7. It is configured such that rotational power output from the engine 2 and the like is transmitted to the rear wheels 3 through a wheel shaft 8 extending leftward and rightward from the differential 7. An exhaust pipe extends rightward from the engine 2, and a catalytic device 2a is installed on the upstream side of the exhaust pipe. Although not illustrated, the exhaust pipe extends rearward, and an end portion thereof on the downstream side is connected to a silencer installed at a rear portion of the vehicle 1.

To enable driving of front wheels 9 in the vehicle 1 in the present embodiment, an in-wheel motor 20B (one example of the disclosed motor) having a columnar outer shape is incorporated in each of the left and right front wheels 9. Each in-wheel motor 20B rotatably drives a corresponding one of the front wheels 9 independently. The in-wheel motors 20B function as, for example, assist motors that each generate power and transmit the power to the front wheels 9 corresponding thereto at a time of starting the vehicle 1. Note that when the drive motor 20A and the in-wheel motors 20B are not particularly distinguished from each other, these motors may be collectively referred to as the motor 20.

The second inverter 30 to which the disclosed technology is applied is integrated (constitutes the disclosed electric drive unit) with one end of the in-wheel motor 20B of the vehicle 1 in the rotational axis direction. The in-wheel motor 20B and the second inverter 30 (second electric drive unit 10B) integrated with each other are assembled to the vehicle body of the vehicle 1 in a state in which the side of the second inverter 30 is directed inward in the vehicle width direction.

The high-voltage battery 5 for driving is installed on each of left and right sides of the floor tunnel 1c on the lower side of the floor panel 1b. The high-voltage battery 5 is constituted by a plurality of mutually coupled battery modules each constituted by a plurality of battery cells (lithium-ion batteries or the like). The high-voltage battery 5 has a large capacity and thus has a flat shape extending widely along the floor panel 1b.

The high-voltage battery 5 supplies direct-current power to each of the first and second inverters 30 (also simply referred as the inverter 30 when these inverters 30 are not particularly distinguished from each other). The inverter 30 converts supplied direct-current power into alternating-current power. The inverter 30 supplies the alternating-current power to the drive motor 20A to rotate the rear wheels 3 and supplies the alternating-current power to the in-wheel motors 20B to rotate the front wheels 9 (so-called power running).

The vehicle 1 also performs regeneration processing. In other words, the drive motor 20A and the in-wheel motors 20B are also utilized as power generators. When power is generated by the drive motor 20A or the in-wheel motors 20B at a time of deceleration of the vehicle, the alternating-current power is converted into direct-current power by the inverter 30. The direct-current power is supplied to the high-voltage battery 5 to charge the high-voltage battery 5.

As illustrated in FIG. 2, the disclosed inverter 30 is thin and lightweight differently from inverters known in the art.

Specifically, the first inverter 30 is disposed adjacent to one end (rear end) of the drive motor 20A in the rotational axis direction (direction in which a rotational axis J extends in FIG. 2) to be integrated therewith. The drive motor 20A has a columnar outer shape centered at the rotational axis J. Meanwhile, the outer shell of the first inverter 30 is constituted by a case (thin case 31) having a thin thickness and has an outer shape in a disk shape having an outer diameter substantially the same as the outer diameter of the drive motor 20A. The thin case 31 is assembled to the rear end of the drive motor 20A in a state in which the thickness direction thereof coincides with the rotational axis direction of the drive motor 20A.

In the present embodiment, a thickness (the size in the rotational axis direction) Wiv of the thin case 31 is designed to be less than or equal to 50 mm. Preferably, the thickness Wiv of the thin case 31 is less than or equal to 30 mm. Similarly, the second inverter 30 integrated with the in-wheel motor 20B also has a thin thickness.

With technology known in the art, incorporating electronic components that constitute an inverter in a case having such a thickness is extremely difficult and is not achieved actually. In contrast, in the disclosed inverter 30, the shapes and the layout of main electronic components of the inverter are devised as described later. Consequently, it is possible to accommodate these electronic components in a space having a small thickness and, as a result, possible to achieve such a thin and lightweight inverter 30.

With such reductions in the thickness and the weight of the inverter, the vehicle 1 in which the inverter is mounted can obtain various merits. For example, a large and heavy inverter known in the art is generally disposed, as indicated by an imaginary line α1 in FIG. 1, below the floor panel 1b adjacent to a side of the drive motor 20A.

In such a case, the inverter is required to have a flat shape due to height limitation. The inverter occupies a specific large region below the floor panel 1b. Thus, the high-voltage battery 5 with known technology can be installed only in a range indicated by an imaginary line α2. As a result, layout design of devices below the floor panel 1b is significantly limited.

It may be possible to dispose the inverter on the upper side of the drive motor 20A or the automatic transmission 4. In such a case, however, the size of the floor tunnel 1c is increased and generate a problem that the vehicle interior is narrowed. In contrast, the inverter 30 according to the disclosed technology can be installed with little restriction on the side of the vehicle 1.

Accordingly, flexibility in layout design of onboard devices is increased. Consequently, as shown in the vehicle 1, it becomes possible to, for example, increase the capacity of the high-voltage battery 5 and possible to improve the performance of the vehicle 1. In the disclosed inverter 30, a weight reduction is also accelerated, and thus, fuel consumption and electricity consumption are also improved. Further, combining with the in-wheel motors 20B is facilitated, as in the vehicle 1, and thus, the vehicle 1 having higher performance can be achieved.

Motor

Figure 3:
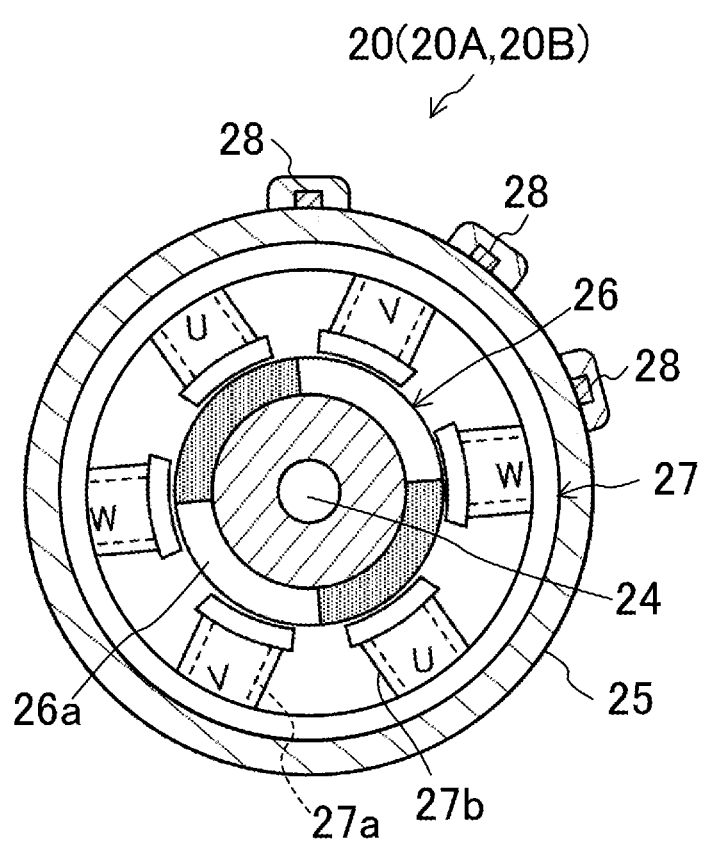
FIG. 3 is a schematic view for describing a structure of a motor constituting the electric drive unit.

FIG. 3 simply illustrates a structure of the motor 20. The motor 20 is a so-called permanent magnet-type synchronous motor. A shaft 24 (constituting the front shaft 21 and the rear shaft 22) is rotatably supported at the center of a cylindrical motor case 25. To the shaft 24, a columnar rotor 26 is fixed. At the outer peripheral part of the rotor 26, a permanent magnet 26a is installed. Consequently, a plurality of N-poles and S-poles are alternately disposed to be arranged at equal intervals in the circumferential direction.

At the periphery of the rotor 26, a stator 27 is coaxially disposed. The stator 27 has a plurality (six in the illustrated example) of teeth 27a projecting radially at equal intervals from an annular core toward the rotor 26. The tip of each of the teeth 27a faces the rotor 26 with a gap therebetween. An electric wire is wound around each of these teeth 27a to form a plurality of coils 27b.

These coils 27b constitute a coil group of these phases including a U-phase, a V-phase, and a W-phase. The coils 27b of respective phases are disposed to be arranged alternately in the circumferential direction. The motor 20 is provided with relay terminals 28 of each of the U-phase, the V-phase, and the W-phase. To these relay terminals 28, the electric wires constituting the coils 27b of the respective phases are connected. Alternating-current power controlled by the inverter 30 is supplied to the coils 27b of the respective phases, and a magnetic field change is thereby periodically generated between the rotor 26 and the stator 27. The magnetic field change acts on the permanent magnet 26a, and the rotor 26 and the shaft 24 are thereby rotated around the rotational axis.

FIG. 3 schematically illustrates a basic structure of the motor 20. The number of the magnetic poles, the structure, and the like of the rotor 26 or the stator 27 are selected in accordance with the specifications of the motor 20. For example, a motor of a type (so-called concentrated winding) in which the coil 27b is formed for each of the teeth 27a is illustrated in FIG. 3. However, a motor of a type (so-called distributed winding) in which an electric wire is wound around the plurality of teeth 27a may be employed. Alternatively, the motor 20 may be of an outer rotor type in which the rotor 26 is positioned on the outer side of the stator 27.

Inverter

Figure 4:
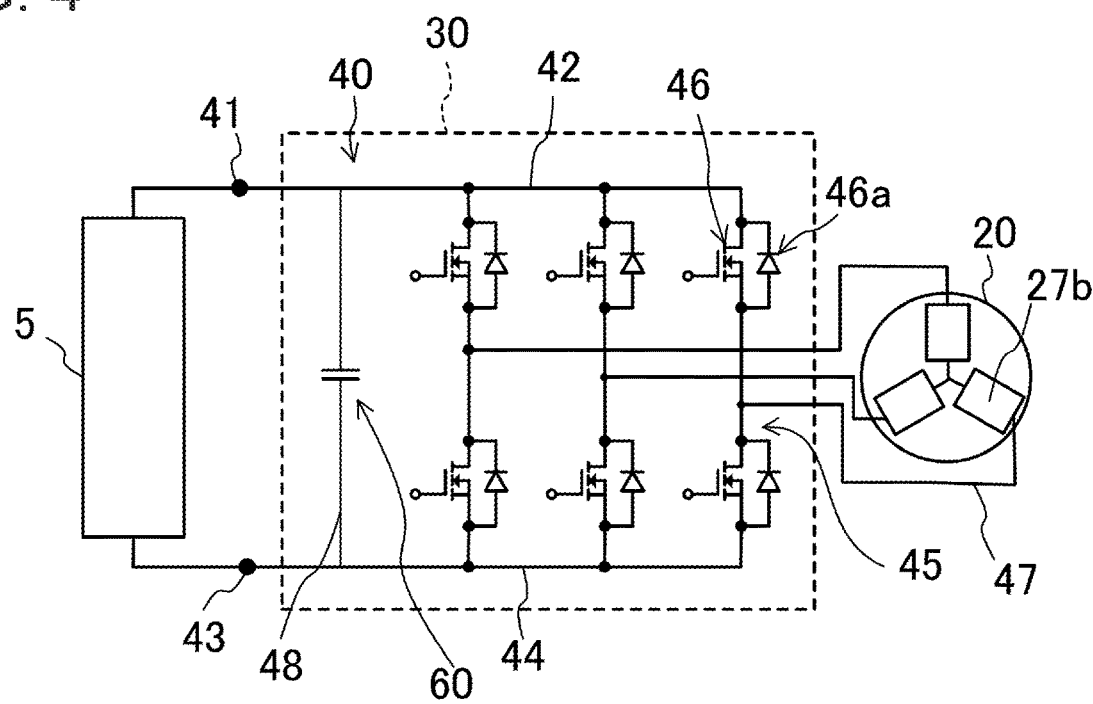
FIG. 4 is a basic circuit diagram of an inverter constituting the electric drive unit.

FIG. 4 illustrates a basic circuit diagram of the inverter 30. In accordance with the motor 20 of a three-phase type, the inverter 30 is provided with an inverter circuit 40 that converts direct-current power into alternating-current power of three phases (the U-phase, the V-phase, and the W-phase) and outputs the alternating-current power. The inverter circuit 40 is publicly known.

The inverter circuit 40 is provided with a positive wire 42 having a positive-side direct-current terminal 41 at one end thereof, and a negative wire 44 having a negative-side direct-current terminal 43 at one end thereof. The positive-side direct-current terminal 41 is connected to the positive electrode of the high-voltage battery 5. The negative-side direct-current terminal 43 is connected to the negative electrode of the high-voltage battery 5. Between the positive wire 42 and the negative wire 44, three circuits (half bridge circuits 45) for energizing the coils 27b of the respective phases are connected in parallel.

Each of the half bridge circuits 45 has two switching elements 46 that are connected in series. A free wheel diode 46a is connected anti-parallel to each of the switching elements 46. Between these two switching elements 46, output wires 47 are connected. Each of the output wires 47 is connected via the relay terminals 28 to a corresponding one of the coils 27b of the respective phases of the motor 20.

During the operation of the inverter 30, each of the switching elements 46 is turned on and off at a high speed (switching control). Consequently, current having a pseudo alternating-current waveform is formed, and the current flows to the motor 20 via the positive wire 42 and the output wire 47 of any one of the phases. Via the output wires 47 of the remaining phases, the current flows from the motor 20 to the negative wire 44. The switching elements 46 for turning on and off large current at high speed under a high voltage is required to have high durability both electrically and mechanically.

As the switching elements 46 capable of fulfilling such requirements, an insulated gate bipolar transistor (IGBT) or a power metal oxide semiconductor field effect transistor (MOSFET) is generally used. The IGBT is mainly used in many cases.

In contrast, in the disclosed inverter 30, a silicon carbide metal oxide semiconductor field effect transistor (SiC MOSFET) is used as the switching elements 46.

The SiC MOSFET is publicly known. The SiC MOSFET has low electric resistance and excellent heat resistance compared with the IGBT and the power MOSFET since SiC, in which physical properties are more stable than Si, is used as a material in the SiC MOSFET. Consequently, the chip size of the SiC MOSFET can be reduced more than the IGBT and the power MOSFET having the same performance.

Figure 5:
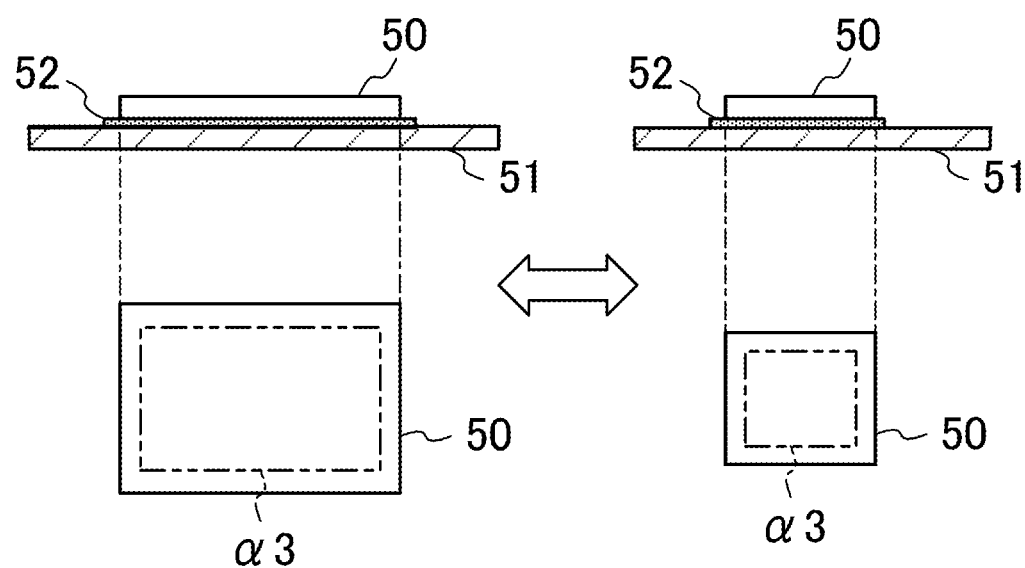
FIG. 5 is a view for comparison between chips of an IGBT and a SiC MOSFET.

FIG. 5 schematically illustrates a chip 50 of the IGBT and a chip 50 of the SiC MOSFET. Each of the chips 50 of the SiC MOSFET and the IGBT has a thin plate shape, and the lower surface thereof is joined to a heat dissipation plate 51 for cooling by solder 52. A peripheral part of the upper surface of each of the chips 50 is provided with a gate and the like (not illustrated). In a state of being embedded in an insulating resin, each chip 50 is incorporated, together with a wire, in an electronic component.

Accordingly, a reduction in the size of the chip can reduce the size of the electronic component in which the chip is incorporated. In particular, the size of a later-described power module 70 can be more effectively reduced since the power module 70 includes two switching elements 46 connected in series.

Meanwhile, in the case of the IGBT, a relatively large coolable range (the range indicated by a two-dot chain line α3) can be obtained also at the upper surface since the surface area of the IGBT is large. Accordingly, it is possible to perform cooling effectively by joining the heat dissipation plate 51 also to the upper surface similarly to the lower surface. Meanwhile, in the SiC MOSFET having a small surface area, it is not possible to reduce the size of a section provided with the gate and the like, and a coolable range is thus very small.

Therefore, in the case of the SiC MOSFET, cooling the upper surface thereof is inefficient. Accordingly, it is effective in the SiC MOSFET to cool the lower surface thereof actively without cooling the upper surface thereof actively. Thus, the disclosed inverter 30 is devised to be capable of efficiently cooling the lower surface of the SiC MOSFET. As a result, a cooling structure for cooling the upper surface of the SiC MOSFET is omitted or simplified, and the SiC MOSFET can be thinner than the IGBT.

Smoothing Capacitor

As illustrated in FIG. 4, a smoothing capacitor 60 is connected via a bridging wire 48 to a part of the positive wire 42 and the negative wire 44 that are positioned between the positive-side and negative-side direct-current terminals 41 and 43 and the three half bridge circuits 45. The smoothing capacitor 60 constitutes the inverter circuit 40 and smooths a voltage applied between the positive wire 42 and the negative wire 44.

To be compatible with high voltages, the smoothing capacitor 60 is required to have a large capacity. Therefore, the disclosed inverter 30 is constituted by a plurality of element capacitors 60a connected in parallel, as described later. In other words, small-capacity capacitors (in detail, film capacitors) are connected in parallel to each other to constitute the smoothing capacitor 60 having a desired capacity. That is, the smoothing capacitor 60 of the disclosed inverter 30 is not a single capacitor but is a unitized capacitor (constituting a smoothing capacitor unit).

With the unitized smoothing capacitor 60, flexibility in design is increased since the number of the element capacitors 60a is selectable in accordance with a desired capacity. Further, in the disclosed inverter 30, the form of the smoothing capacitor 60 is also devised (details will be described later) to achieve a thickness reduction and an efficiency increase.

Busbar

A large current flows through the electric wires including the positive wire 42, the negative wire 44, the bridging wire 48, and the like illustrated in FIG. 4. Therefore, generally, a metal part (busbar) constituted by a copper plate or the like is used to constitute each of these electric wires. When the busbar is long, electric resistance is high, and a copper loss increases. The amount of generated heat also increases.

Moreover, since the large current is turned on and off at a high speed by switching control, a large magnetic change is generated in the busbar accordingly. As a result, noise, vibration, electromagnetic interference, and the like are generated in the busbar in response to the inverter being operated. Those may lead to an energy loss and may adversely and variously affect the performance of the vehicle 1.

When the busbar has a complex shape by, for example, being bent, the effect thereof is more noticeable. A difference in the shapes of the busbars required to have uniformity, such as positive and negative electrodes, also deteriorates controllability of the motor.

To suppress these inconveniences, reducing and equalizing the inductances of the busbars are effective. Thus, in the disclosed inverter 30, the shapes and the arrangement of the busbars are devised (details will be described later) so that the inductances of the busbars can be reduced and equalized to reduce heat generation, noise, and the like generated due to the busbars while addressing thickness and weight reductions and an efficiency improvement of the inverter.

Power Module

Figure 6:
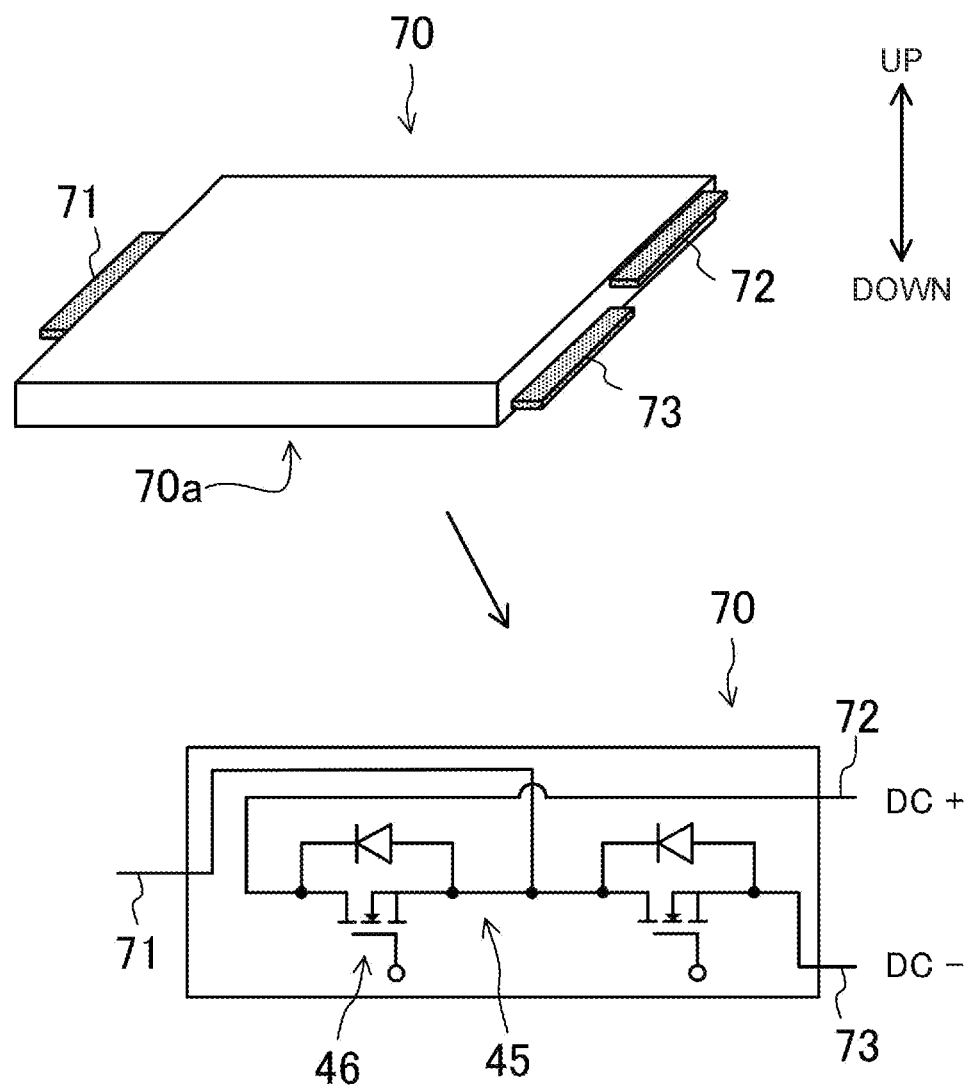
FIG. 6 is a view for describing a power module.

FIG. 6 illustrates the power module 70 according to the present embodiment. The power module 70 is a small flat electronic component having a small thickness. Each of the upper and lower surfaces of the power module 70 has a rectangular shape. One (first end portion) of short end portions thereof is provided with one output terminal 71. The other (second end portion positioned opposite the first end portion) of the short end portions thereof is provided with two terminals (a positive electrode terminal 72 and a negative electrode terminal 73).

In the power module 70, the positive electrode terminal 72 and the negative electrode terminal 73 are positioned away from each other in the up-down direction and positioned away from each other also in the width direction to avoid contact therebetween. The positive electrode terminal 72 is displaced toward the upper surface, and the negative electrode terminal 73 is displaced toward the lower surface. The lower surface of the power module 70 is constituted by a flat surface (installation surface 70a).

As simply illustrated in FIG. 6, the half bridge circuit 45 including the two switching elements 46 (SiC MOSFET) is configured in the inner portion of the power module 70. The two switching elements 46 connected in series are disposed along the long sides of the power module 70. As described above, the chip 50 of the SiC MOSFET is used in each switching element 46. Thus, the size and the thickness of the power module 70 are also reduced.

The positive electrode side of the half bridge circuit 45 is connected to the positive electrode terminal 72. The negative electrode side of the half bridge circuit 45 is connected to the negative electrode terminal 73. The output terminal 71 is connected between the two switching elements 46. In the inverter 30, three power modules 70 are used to constitute the half bridge circuits 45 of the U-phase, the V-phase, and the W-phase.

Figure 7:
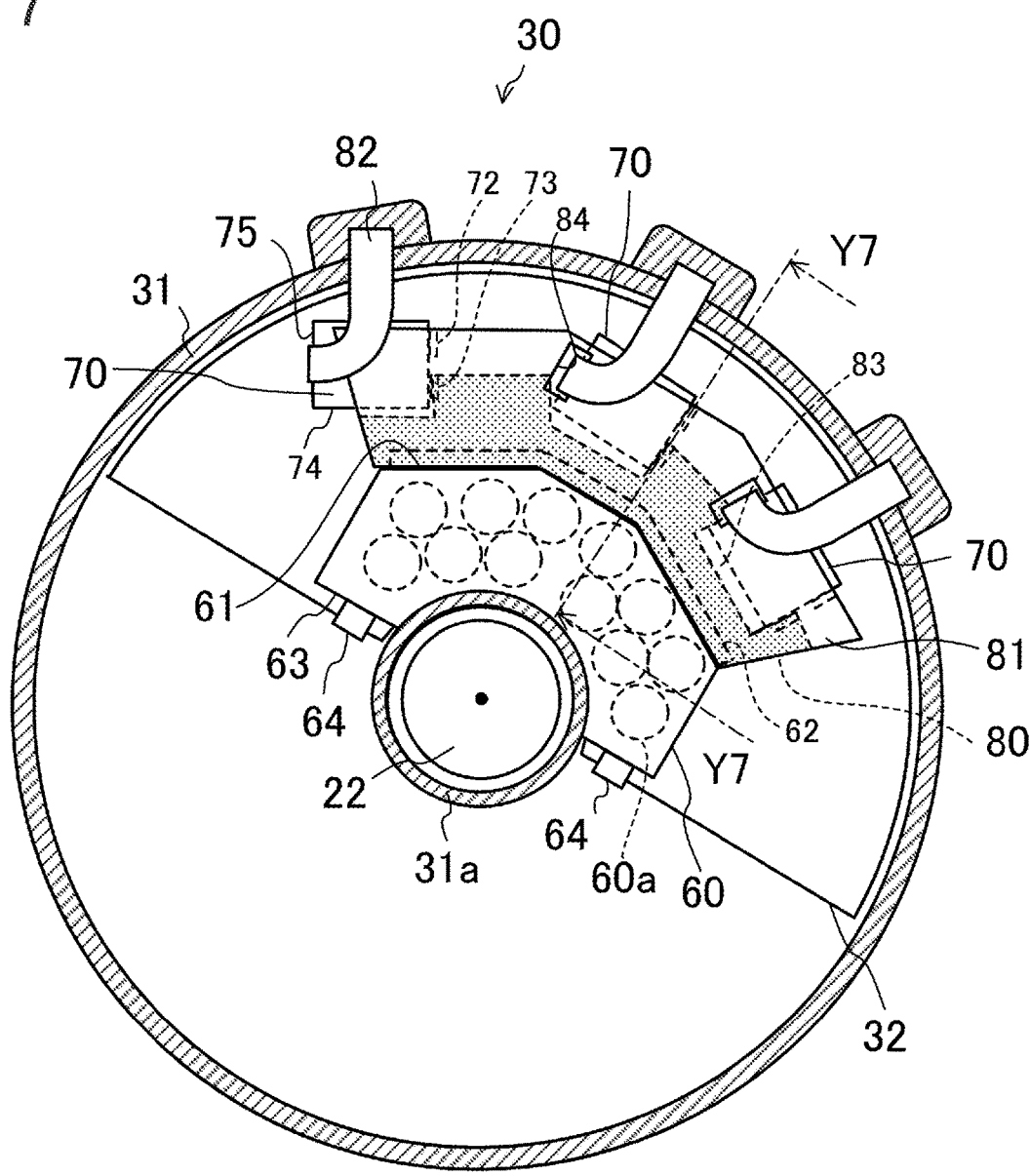
FIG. 7 is a view roughly illustrating a principal portion of an inverter of the first electric drive unit.
Figure 8:
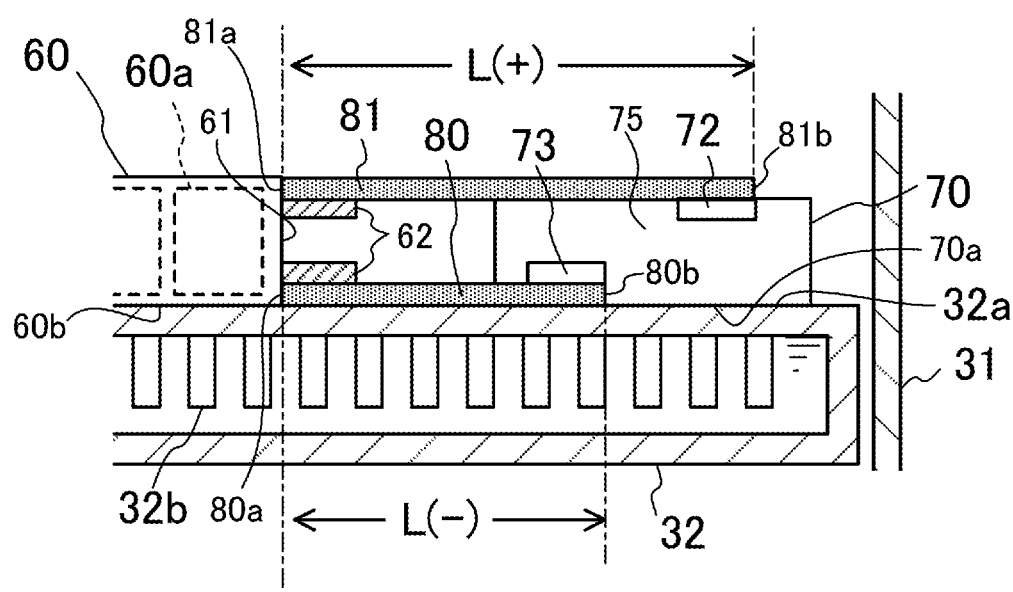
FIG. 8 is a schematic sectional view of a part indicated by arrow Y7 in FIG. 7.

Specific Configuration of Power Module, Smoothing Capacitor, Busbar, and the Like, and Arrangement Thereof FIG. 7 is a view in which the inner portion (the inner portion of the thin case 31) of the first inverter 30 is viewed from the side opposite to the drive motor 20A. FIG. 8 is a schematic sectional view of the part indicated by arrow Y7 in FIG. 7. In description, the near side in FIG. 7 is referred to as the upper side.

In the thin case 31, the three power modules 70, the smoothing capacitor 60, a negative-electrode-side busbar 80 (first busbar), a positive-electrode-side busbar 81 (second busbar), output-side busbars 82, and the like are accommodated in a predetermined arrangement. Although, in addition to those, members such as a control substrate for executing switching control and the like are accommodated in the thin case 31, illustration thereof is omitted. The inner portion of the thin case 31 is filled with an insulating resin. Illustration thereof is also omitted.

Cooling Plate

As described above, the thin case 31 has a disk shape. A center portion thereof is provided with a cylindrical shaft cylinder portion 31a for inserting the rear shaft 22. In the present embodiment, a semi-circular cooling plate 32 is disposed in a substantially half region of the thin case 31. As illustrated in FIG. 8, the cooling plate 32 is a hollow metal member excellent in thermal conductivity. The cooling plate 32 is disposed on the lower side (the side of the drive motor 20A) of the thin case 31.

The upper surface of the cooling plate 32 constitutes a flat support surface 32a that extends in a direction orthogonal to the rotational axis direction. The lower surfaces of the smoothing capacitor 60 and each of the power modules 70 constitute flat installation surfaces 60b and 70a, respectively. The smoothing capacitor 60 and each of the power modules 70 are placed on the support surface 32a via the installation surfaces 60b and 70a, respectively.

In other words, the smoothing capacitor 60 and each of the power modules 70 are disposed in the inner portion of the thin case 31 so as to be arranged on the same plane (on the support surface 32a) orthogonal to the rotational axis direction.

As illustrated in FIG. 2, the thin case 31 is provided with a fluid inflow pipe 33 and a fluid outflow pipe 34. It is configured such that a cooling fluid is supplied to and circulated in the inner portion of the cooling plate 32 through the fluid inflow pipe 33 and the fluid outflow pipe 34. A plurality of projections 32b are provided on the back side of the support surface 32a facing the inner portion of the cooling plate 32.

Due to these projections 32b, the area of the back side of the support surface 32a is increased. Consequently, heat exchange with the cooling fluid is accelerated, and the coolability of the support surface 32a is improved. As a result, the smoothing capacitor 60 and each of the power modules 70 placed on the support surface 32a can be effectively cooled.

Smoothing Capacitor

In a state of being adjacent to the shaft cylinder portion 31a, the smoothing capacitor 60 is disposed at the center side of the thin case 31. The three power modules 70 are disposed at the outer peripheral side of the thin case 31 to be arranged with intervals therebetween in the circumferential direction (direction around the rotational axis J) and are disposed to be arranged along the periphery of the smoothing capacitor 60.

In the present embodiment, each of the power modules 70 is disposed such that respective terminals are directed in the circumferential direction. Specifically, the positive electrode terminal 72 and the negative electrode terminal 73 of each of the power modules 70 are positioned at one (first circumferential end portion 75) of end portions (circumferential end portions 75) mutually facing in the circumferential direction orthogonal to an inner-side end portion (inner end portion 74) facing the smoothing capacitor 60. These terminals 72 and 73 mutually face in the clockwise direction in FIG. 7. Each output terminal 71 is positioned at the other (the second circumferential end portion 75 positioned opposite the first circumferential end portion 75) of the circumferential end portions 75. The output terminals 71 mutually face in the counterclockwise direction in FIG. 7.

In the present embodiment, a side surface portion (alternating-current-side side surface portion 61) of the smoothing capacitor 60 facing the three power modules 70 has a polygonal shape constituted by three opposing surfaces opposite a corresponding one of the power modules 70. As illustrated in FIG. 7 and FIG. 8, a pair of alternating-current-side terminals 62 (the lower side is the negative side and the upper side is the positive side) extending along the edge of the alternating-current-side side surface portion 61 are provided at positions on the alternating-current-side side surface portion 61 vertically away from each other.

Each of the power modules 70 and the smoothing capacitor 60 are disposed such that the sizes of gaps between each of the power modules 70 and the smoothing capacitor 60 are substantially the same.

These electronic components 60 and 70 are connected to each other by the negative-electrode-side busbar 80 and the positive-electrode-side busbar 81 each having a plate shape. Accordingly, current flows through the busbars 80 and 81. Thus, the gap between these electronic components 60 and 70 corresponds to the wiring length. By making the wiring lengths substantially the same, it is possible to equalize the inductance between each power module 70 and the smoothing capacitor 60, as described later. Equalizing the inductance can suppress deterioration in the controllability of the motor 20.

As described above, the smoothing capacitor 60 is constituted by the plurality of element capacitors 60a connected in parallel. Accordingly, the outer shape of the smoothing capacitor 60 can be freely set by changing the arrangement of these element capacitors 60a. The smoothing capacitor 60 can be formed in a flat shape by selecting low-height element capacitors 60a and laterally disposing the element capacitors 60a. In this case, even when the capacity is increased, the thin thickness of the inverter 30 can be maintained since the capacity increase can be performed by only expanding the size of the smoothing capacitor 60 in the lateral direction.

Preferably, the element capacitors 60a arranged to face the three power modules 70 are disposed along the alternating-current-side side surface portion 61 so as to be along the arrangement of the power modules 70. In this case, the distance between the element capacitors 60a and each of the power modules 70 can be shortened, and reducing and equalizing the inductance can be accelerated.

A side surface portion (direct-current-side side surface portion 63) of the smoothing capacitor 60 that is present opposite to the alternating-current-side side surface portion 61 is provided with a pair of direct-current-side terminals 64. The direct-current-side terminals 64 each constitute a corresponding one of a positive-side direct-current terminal 41 and a negative-side direct-current terminal 43 of the inverter circuit 40 and are each connected indirectly to a corresponding electrode of the high-voltage battery 5.

Negative-Electrode-Side Busbar and Positive-Electrode-Side Busbar

The negative-electrode-side busbar 80 and the positive-electrode-side busbar 81 connect the smoothing capacitor 60 to the three power modules 70 constituting the half bridge circuits 45. In other words, in the inverter circuit 40, these busbars 80 and 81 constitute parts that correspond to the bridging wire 48, the positive wire 42, and the negative wire 44 that are positioned between the smoothing capacitor 60 and the half bridge circuits 45.

Therefore, the large current flows through these busbars 80 and 81. Moreover, the large current fluctuates due to switching control. Consequently, a large amount of heat and a large magnetic change are generated in these busbars 80 and 81. When the negative-electrode-side busbar 80 and the positive-electrode-side busbar 81 have complex shapes, the effect thereof is more noticeable. The magnetic change in these busbars 80 and 81 causes noise, vibration, electromagnetic interference, and the like. Those may lead to an energy loss and may adversely and variously affect the performance of the vehicle 1.

In contrast, in the disclosed inverter 30, these busbars 80 and 81 each have a plate shape extending in the circumferential direction and having a large lateral width (although the name of these busbars is preferably "bus plate" in consideration of the shape thereof, the name "busbar," which is a common name, is used here). An outer edge portion (edge portion positioned on the outer side in the radial direction) of one of the busbars is connected to the positive electrode terminal 72 or the negative electrode terminal 73 of each of the power modules 70, and an inner edge portion (edge portion positioned on the inner side in the radial direction) of the other of the busbars is connected to a corresponding terminal of the smoothing capacitor 60.

Specifically, an outer edge portion 80b of the negative-electrode-side busbar 80 is connected to the negative electrode terminal 73 of each of the power modules 70, and an inner edge portion 80a of the negative-electrode-side busbar 80 is connected to the alternating-current-side terminal 62 of the negative side of the smoothing capacitor 60. An outer edge portion 81b of the positive-electrode-side busbar 81 is connected to the positive electrode terminal 72 of each of the power modules 70, and an inner edge portion 81a of the positive-electrode-side busbar 81 is connected to the alternating-current-side terminal 62 of the positive side of the smoothing capacitor 60.

The negative-electrode-side busbar 80 is positioned on the lower side of the positive-electrode-side busbar 81 and, as clearly illustrated by dots in FIG. 7, is formed and disposed to be fitted into a gap between each of the power modules 70 and the smoothing capacitor 60. Specifically, the inner edge portion 80a of the negative-electrode-side busbar 80 has a polygonal shape corresponding to the polygonal shape of the alternating-current-side side surface portion 61. The outer edge portion 80b of the negative-electrode-side busbar 80 has a polygonal shape similar to the shape of the inner edge portion 80a.

Parts that overlap a corresponding one of the power modules 70 are notched, and three recessed portions 83 are thereby formed on the side of the outer edge portion 80b of the negative-electrode-side busbar 80. The power modules 70 are fitted into the recessed portions 83 corresponding thereto. Consequently, in a state of being fitted into the gap between each of the power modules 70 and the smoothing capacitor 60, the negative-electrode-side busbar 80 extends along each of the power modules 70 and the smoothing capacitor 60 in the circumferential direction.

As illustrated in FIG. 8, in a state of being placed on the support surface 32a of the cooling plate 32, the negative-electrode-side busbar 80 is joined to the alternating-current-side terminal 62 of the negative side of the smoothing capacitor 60 and the negative electrode terminal 73 of each of the power modules 70.

The positive-electrode-side busbar 81 is disposed above the negative-electrode-side busbar 80 and, as illustrated in FIG. 7, has a plate shape extending along the surface of each of the power modules 70. Specifically, as with the negative-electrode-side busbar 80, the inner edge portion 81a of the positive-electrode-side busbar 81 has a polygonal shape corresponding to the polygonal shape of the alternating-current-side side surface portion 61. The outer edge portion 81b of the positive-electrode-side busbar 81 has a polygonal shape similar to the shape of the inner edge portion 81a thereof.

Consequently, in a state of extending along the surface of each of the power modules 70, the positive-electrode-side busbar 81 extends along each of the power modules 70 and the smoothing capacitor 60 in the circumferential direction.

As illustrated in FIG. 8, in a state of vertically facing the negative-electrode-side busbar 80 with an interval therebetween, the positive-electrode-side busbar 81 is joined to the alternating-current-side terminal 62 of the positive side of the smoothing capacitor 60 and the positive electrode terminal 72 of each of the power modules 70.

The negative-electrode-side busbar 80 and the positive-electrode-side busbar 81 are each designed to have a flat plate shape having a small thickness and have a short wiring length and a large lateral width (the length in a direction orthogonal to the wiring length). In the present embodiment, due to the shape and the arrangement of the power modules 70, the positive-electrode-side busbar 81 has a longer wiring length than the negative-electrode-side busbar 80.

Relationship Between Shape of Busbar and Inductance

It is common technical knowledge that inductance decreases as the lateral width of a busbar increases and that inductance increases as the wiring length of the busbar increases. However, as a result of examining the relationship between the shape of a busbar and inductance thereof, the present inventors have found that there is a case in which the same inductance is obtained even when wiring lengths are different.

Figure 9:
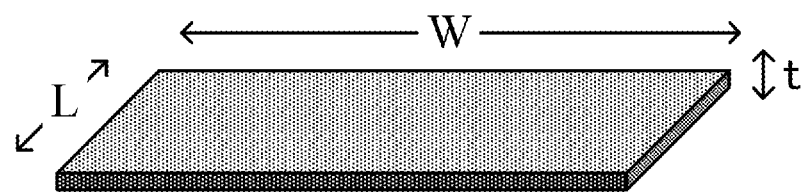
FIG. 9 is a view roughly illustrating a busbar for description.
Figure 10:
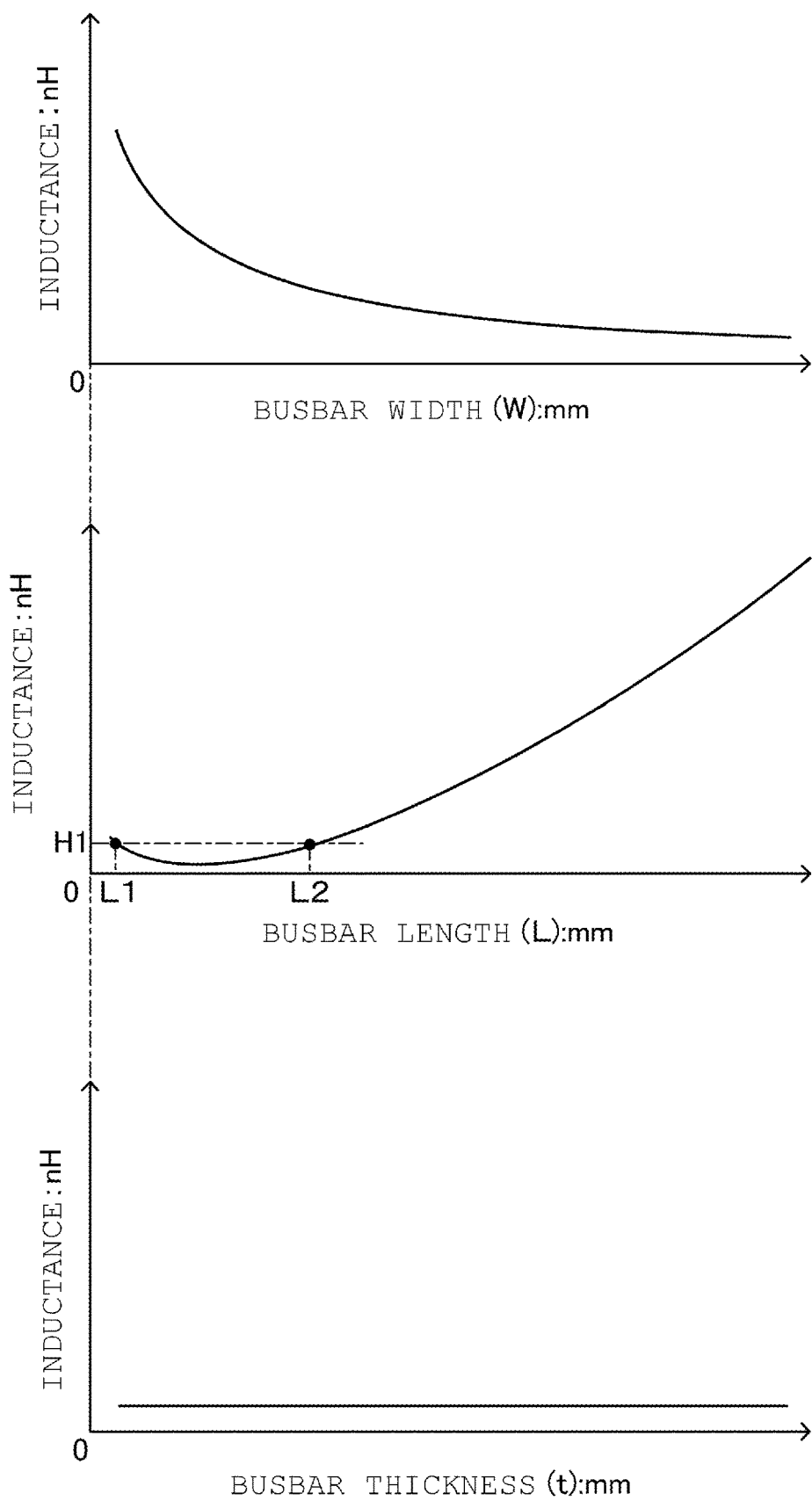
FIG. 10 is a graph showing the relationship between the shape (width, length, and thickness) of the busbar and inductance.

FIG. 9 illustrates a busbar as an example. This busbar represents a busbar having a width W larger than a length L and imitating the negative-electrode-side busbar 80 and the positive-electrode-side busbar 81. The character t denotes thickness. FIG. 10 is a graph summarizing the relationship between a busbar having such a shape and inductance thereof (in detail, inductance sensitivity).

The upper graph shows the relationship between the width W of the busbar and the inductance. The middle graph shows the relationship between the length L of the busbar and the inductance. The lower graph shows the relationship between the thickness t of the busbar and the inductance.

In the busbar in FIG. 9, when the width W increases, the inductance gradually decreases accordingly. It had been considered that, when the length L increases, the inductance similarly increases accordingly. However, it was confirmed that, in the case of the length L, an inflection point is present in a region in which the length L is short.

Thus, as illustrated in FIG. 10, a same inductance H1 can be obtained in both a busbar having a length L1 and a busbar having a length L2. That is, it is possible to design even busbars having different lengths L to have the same inductance as long as the lengths L are in a predetermined range.

It was also confirmed that the thickness t of a busbar hardly affects the inductance. That is, the thickness t of a busbar is practically sufficient to have a required minimum size.

From such findings, the present inventors focused on the fact that reducing the length L, increasing the width W, and a minimum required thickness t are sufficient to reduce and equalize inductances of busbars and that busbars can have the same inductance even when having different lengths. On the basis of these findings, the shapes and the arrangement of the negative-electrode-side busbar 80 and the positive-electrode-side busbar 81 are devised.

Specifically, in the present embodiment, the negative-electrode-side busbar 80 and the positive-electrode-side busbar 81 have different lengths. Thus, the lengths and the widths of the negative-electrode-side busbar 80 and the positive-electrode-side busbar 81 are adjusted such that inductance is substantially the same therebetween. In other words, as with the busbar having the length L1 and the busbar having the length L2 described above, the length L (−) of the negative-electrode-side busbar 80 and the length L (+) of the positive-electrode-side busbar 81 are adjusted together with the widths thereof such that inductance is the same therebetween. Consequently, the inductances of these busbars are equalized. As a result, it is possible to suppress deterioration in the controllability of the motor 20.

Moreover, the negative-electrode-side busbar 80 and the positive-electrode-side busbar 81 are shared among the power modules and are each formed to have a relatively short length and a large lateral width. Therefore, the inductances of the negative-electrode-side busbar 80 and the positive-electrode-side busbar 81 themselves are also reduced. Further, these busbars 80 and 81 each have a large surface area and thus are excellent in heat dissipation properties. The negative-electrode-side busbar 80 having a relatively small surface area is in surface contact with the cooling plate 32 and can be cooled effectively.

The positive-electrode-side busbar 81 not in contact with the cooling plate 32 has a relatively large surface area. Therefore, the positive-electrode-side busbar 81 itself has excellent heat dissipation properties. In addition, due to being in contact with the upper surface of each of the power modules 70, the positive-electrode-side busbar 81 can accelerate heat dissipation of each of the power modules 70.

These busbars 80 and 81 each have a flat plate shape, and the shape is simple. Processing thereof is easily, and a magnetic change can be suppressed. The busbars 80 and 81 have an advantage for a thickness reduction and can be accommodated even in the thin case 31 having a small thickness. Since the positive and negative terminals of each of the three power modules 70 are connected by one busbar, it is also advantageous in terms of the number of components and the number of processes.

Output-Side Busbar

The output-side busbars 82 constitute parts that correspond to the output wires 47 of the inverter circuit 40. That is, the output-side busbars 82 are connected to a corresponding one of the output terminals 71 of each of the power modules 70 and to the relay terminals 28 of a corresponding one of the phases of the drive motor 20A.

In the present embodiment, the output terminals 71 of two of the three power modules 70 are positioned on the lower side of the positive-electrode-side busbar 81. Therefore, an opening portion 84 is formed at each of parts of the upper surface of the positive-electrode-side busbar 81 overlapping the output terminals 71 of these two power modules 70.

One end portion of one of the output-side busbars 82 is joined in a state as it is to the output terminal 71 corresponding thereto, and one end portion of each of the other two of the output-side busbars 82 is joined to the output terminals 71 corresponding thereto through respective opening portions 84. The relay terminals 28 of the respective phases are disposed to correspond to the arrangement of each of the power modules 70. That is, the arrangement of the relay terminals 28 of the respective phases is designed such that the wiring lengths of the output-side busbars 82 are the same.

Therefore, the three output-side busbars 82 are the same metal parts and are the same in length, shape, and the like. Consequently, respective inductances of these output-side busbars 82 are also the same, and the inductances of the output-side busbars 82 are also equalized.

As described above, according to the first electric drive unit 10A in the present embodiment, the size and the weight can be reduced while performance thereof is improved compared with an electric drive unit in which an inverter known in the art is used. Accordingly, when the first electric drive unit 10A is mounted on the vehicle 1, fuel consumption and electricity consumption can be improved while flexibility in design of the vehicle 1 is increased. In addition, noise and the like can be suppressed, and thus, the vehicle 1 that has high performance can be achieved. Although the first electric drive unit 10A has been described in the present embodiment, the contents thereof are also applicable to the second electric drive unit 10B.

Second Embodiment

Figure 11:
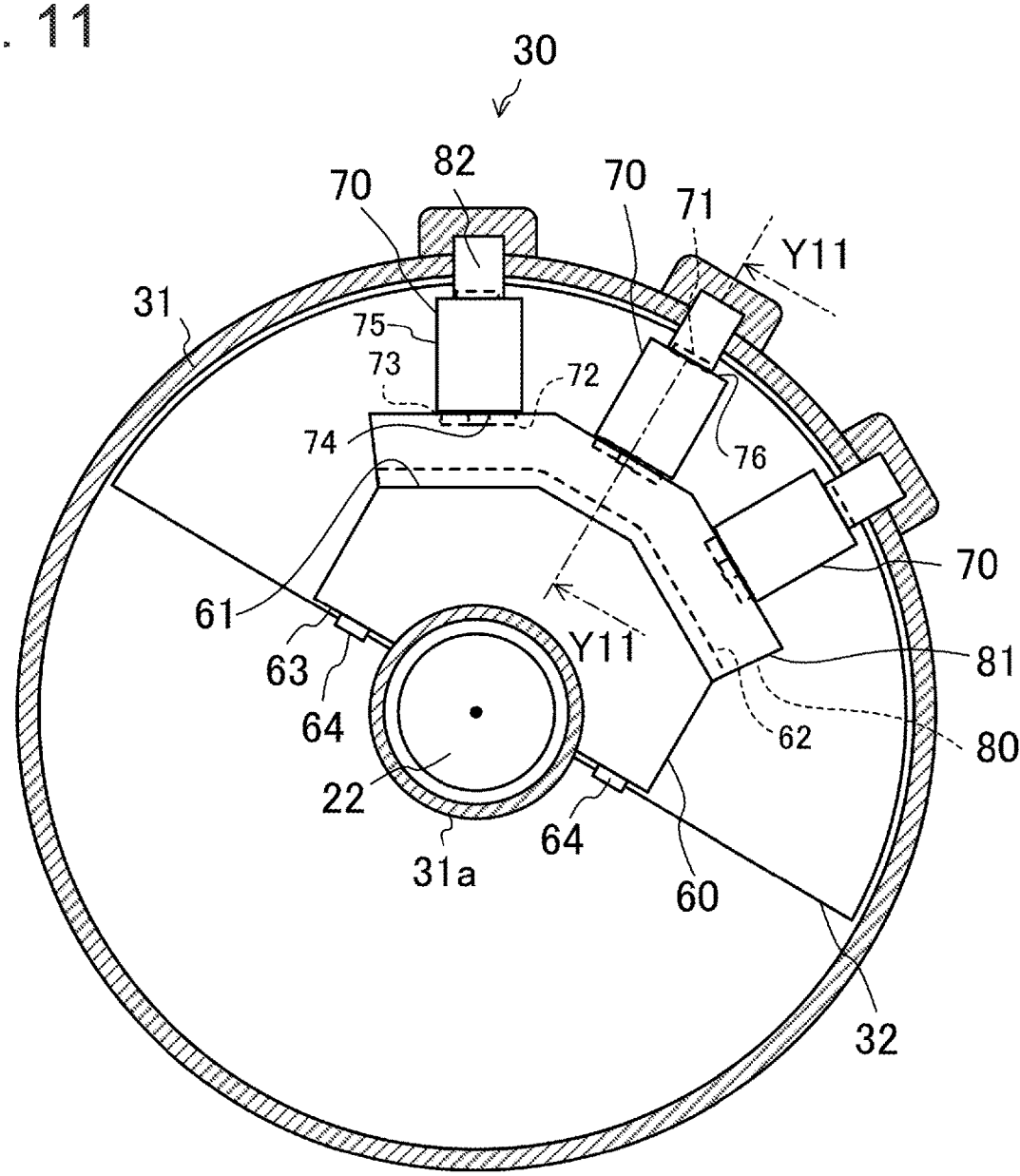
FIG. 11 is a view corresponding to FIG. 7 and illustrating an electric drive unit according to a second embodiment.
Figure 12:
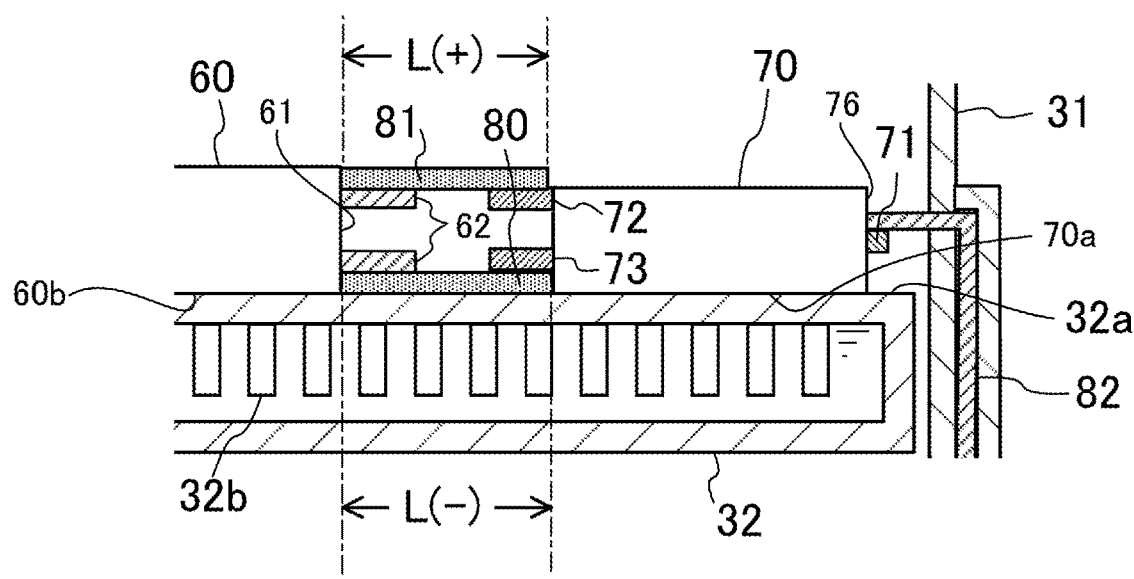
FIG. 12 is a schematic sectional view of a part indicated by arrow Y11 in FIG. 11.

FIG. 11 and FIG. 12 illustrate a second embodiment of the disclosed electric drive unit. FIG. 12 is a schematic sectional view of a part indicated by arrow Y11 in FIG. 11.

Basic configurations of the motor 20, the inverter 30, and the like in the present embodiment are the same as those in the above-described embodiment. Therefore, description of the same configurations as those in the above-described embodiment is omitted by using the same reference signs. Then, configurations that differ from those in the above-described embodiment will be described specifically (the same applies to the other embodiments).

In the present embodiment, the directions of the power modules 70 are different. That is, each power module 70 in the present embodiment is disposed in a state of being rotated by 90 degrees from the state of each power module 70 in the above-described embodiment.

Consequently, each of the power modules 70 in the present embodiment is disposed such that respective terminals are directed in the radial direction (radial direction around the rotational axis J). Specifically, each of the power modules 70 is disposed radially and has both the positive electrode terminal 72 and the negative electrode terminal 73 at the inner end portion 74 positioned at the center side of the thin case 31. Each of the power modules 70 has the output terminal 71 at an end portion (outer end portion 76) that is positioned at the outer peripheral side of the thin case 31 and that does not face the smoothing capacitor 60.

Consequently, as illustrated in FIG. 12, the positive electrode terminal 72 and the negative electrode terminal 73 of each of the power modules 70 are in a state of each facing a corresponding one of the pair of alternating-current-side terminals 62 of the smoothing capacitor 60. Accordingly, the positive-electrode-side busbar 81 and the negative-electrode-side busbar 80 can have the same shape.

Specifically, the same metal part is used for the positive-electrode-side busbar 81 and the negative-electrode-side busbar 80 in the present embodiment. Therefore, these busbars 80 and 81 are the same in terms of length, lateral width, and thickness. In addition, the gap between each of the power modules 70 and the smoothing capacitor 60 is substantially the same, and these busbars 80 and 81 (corresponding to the first busbar) are fitted into the gap.

Each of the positive-electrode-side busbar 81 and the negative-electrode-side busbar 80 in the present embodiment has a plate shape extending in a band shape and has a large lateral width while having a short length. Each of the positive-electrode-side busbar 81 and the negative-electrode-side busbar 80 has a bent shape so as to extend along each of the power modules 70 and the smoothing capacitor 60. The length L (+) of the positive-electrode-side busbar 81 and the length L (−) of the negative-electrode-side busbar 80 are the same. Accordingly, the inductances of the positive-electrode-side busbar 81 and the negative-electrode-side busbar 80 are the same.

The output terminal 71 of each of the power modules 70 is positioned on the radially outer side. Therefore, the output-side busbars 82 connected to these output terminals 71 extend radially as they are and are each connected to a corresponding one of the relay terminals 28 by the shortest distance. The length of each of the output-side busbars 82 is also designed such that wiring lengths are the same. Therefore, the inductances of the output-side busbars 82 are also the same.

Even when the shapes, the arrangement, and the like of the power modules 70 and the busbars 80, 81, and 82 are configured as in the present embodiment, the same effects as those in the above-described embodiment can be obtained. Accordingly, when employing the electric drive unit of the present embodiment, it is possible to achieve size and weight reductions while improving performance compared with an electric drive unit using an inverter known in the art. When mounting the electric drive unit of the present embodiment on a vehicle, it is possible to improve fuel consumption and electricity consumption while increasing flexibility in design of the vehicle. It is also possible to suppress noise and the like and thus possible to achieve a high-performance vehicle.

Third Embodiment

Figure 13:
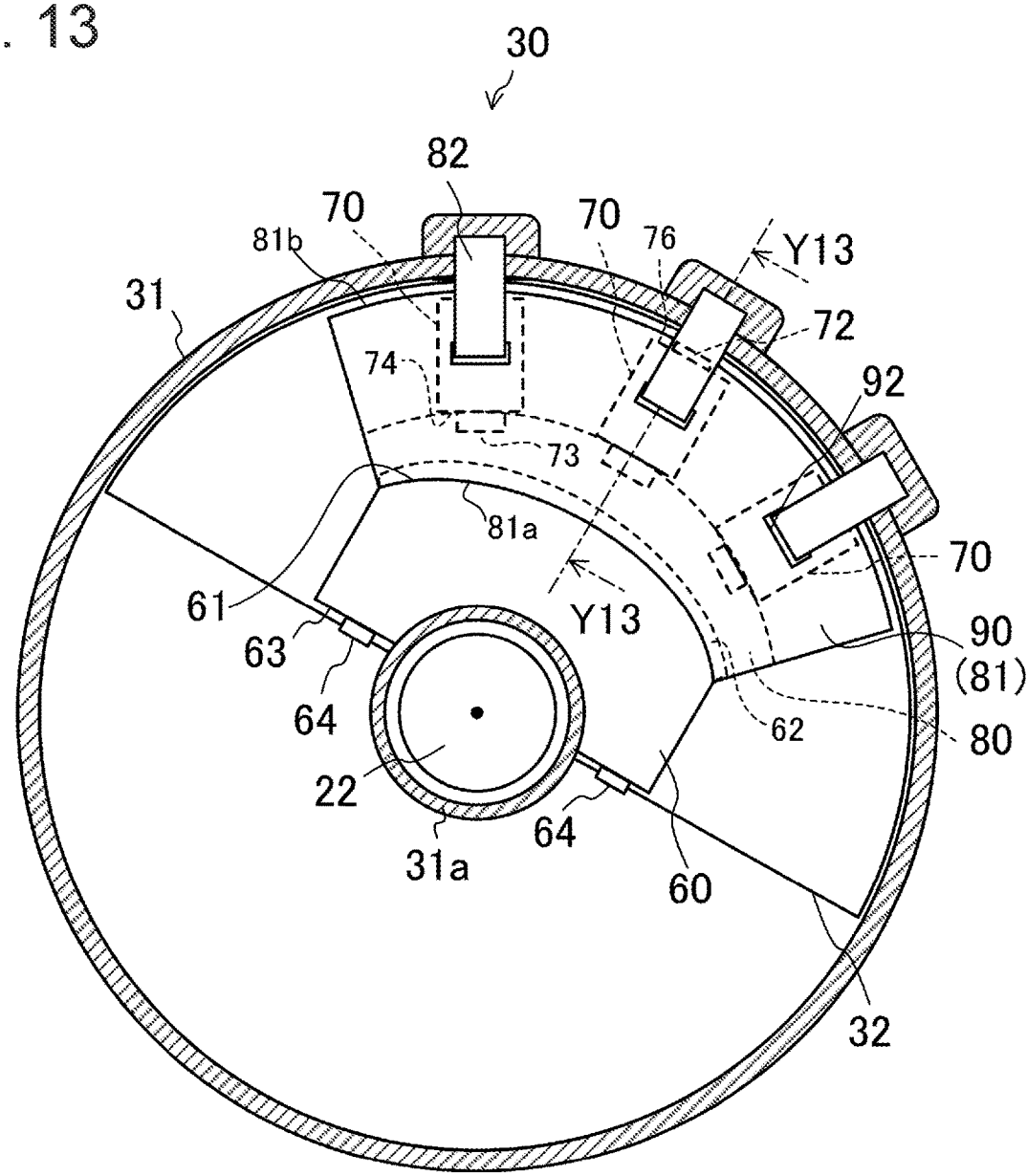
FIG. 13 is a view corresponding to FIG. 7 and illustrating an electric drive unit according to a third embodiment.
Figure 14:
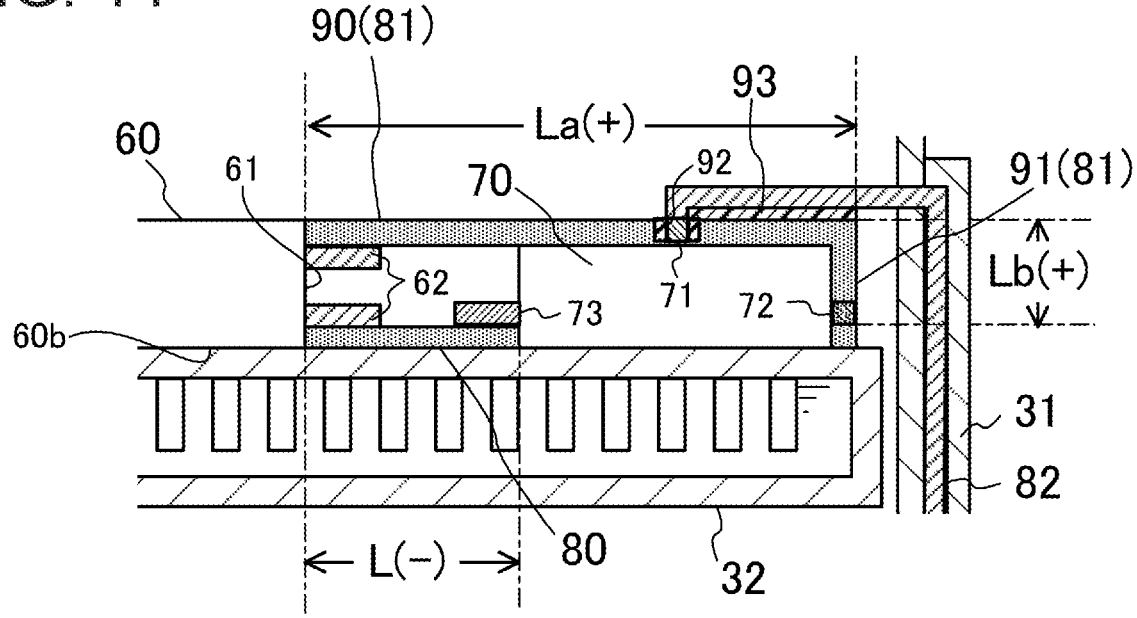
FIG. 14 is a schematic sectional view of a part indicated by arrow Y13 in FIG. 13.
Figure 15:
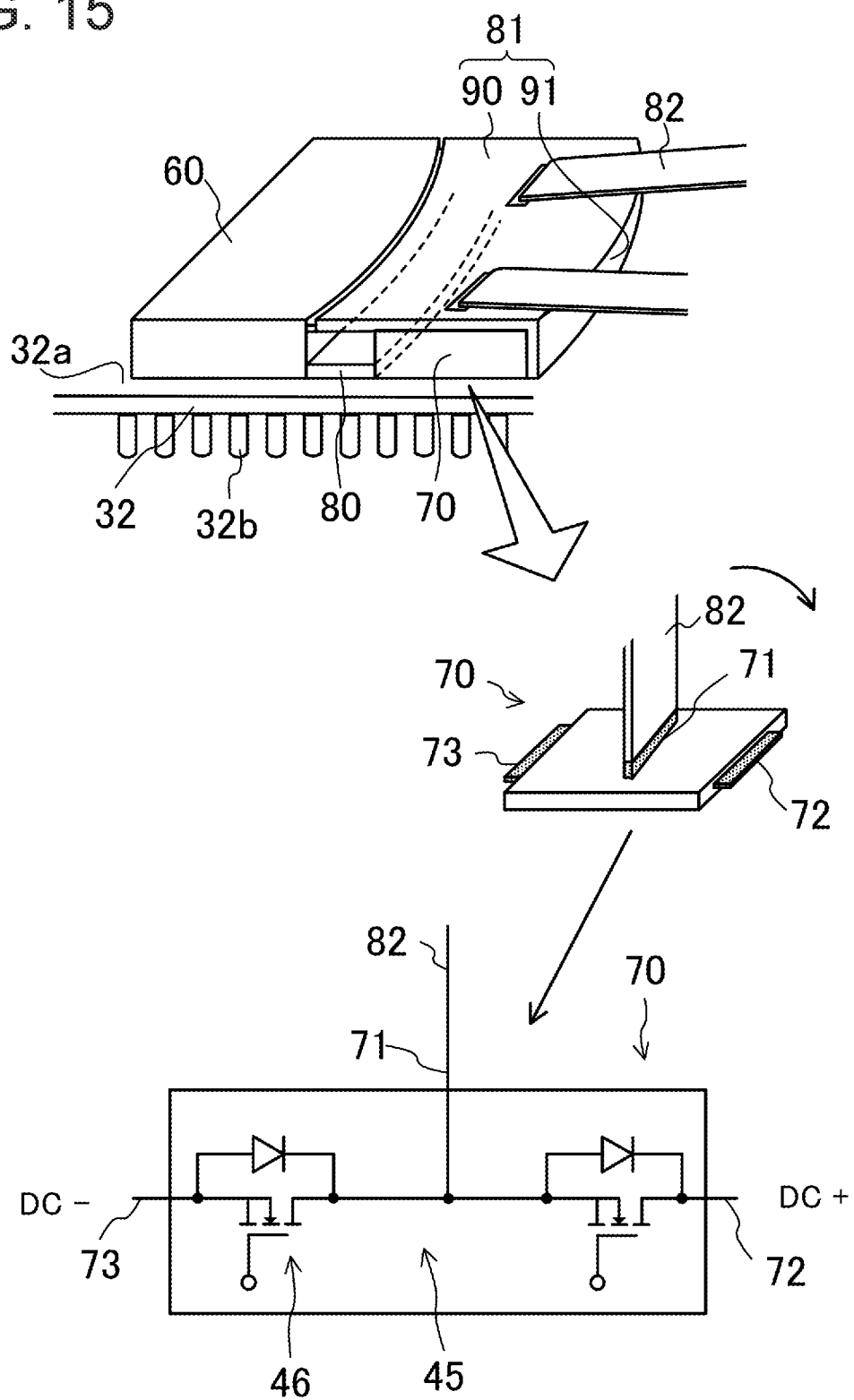
FIG. 15 is a view for describing a principal portion of an inverter and a structure of a power module.

FIG. 13, FIG. 14, and FIG. 15 illustrate a third embodiment of the disclosed electric drive unit. FIG. 14 is a schematic sectional view of a part indicated by arrow Y13 in FIG. 13. FIG. 15 is an explanatory view of a principal portion of the inverter 30 and a structure of the power module 70.

In the present embodiment, the alternating-current-side side surface portion 61 of the smoothing capacitor 60 has an arc shape. Along the edge of the arc shape, the pair of alternating-current-side terminals 62 provided at the alternating-current-side side surface portion 61 also extend in an arc shape.

In the present embodiment, the arrangement of the positive electrode terminal 72, the negative electrode terminal 73, and the output terminal 71 of each power module 70 differs from those in the above-described embodiments. Specifically, as illustrated in FIG. 15, the positive electrode terminal 72 and the negative electrode terminal 73 are disposed in mutually opposite directions in accordance with the array direction of the half bridge circuits 45. The output terminal 71 is also disposed at the upper surface (in detail, an intermediate part thereof in the longitudinal direction) of the power module 70 in accordance with the array direction of the half bridge circuits 45.

As illustrated in FIG. 13, each of the power modules 70 is disposed such that the negative electrode terminal 73 (corresponding to the inner terminal) is positioned at the inner end portion 74 and that the positive electrode terminal 72 (corresponding to the outer terminal) is positioned at the outer end portion 76. The negative electrode terminal 73 is in a state of facing the alternating-current-side terminal 62 of the negative-side. The gap between each of the power modules 70 and the smoothing capacitor 60 is substantially the same.

The negative-electrode-side busbar 80 in the present embodiment has a band plate shape extending in a curved manner. Consequently, similarly to the busbars 80 and 81 in the second embodiment, the negative-electrode-side busbar 80 (corresponding to the first busbar) is fitted into the gap.

The positive-electrode-side busbar 81 (corresponding to the third busbar) in the present embodiment has a plate shape extending in a curved manner along the surface of each of the power modules 70. Specifically, as illustrated in FIG. 14 and FIG. 15, the positive-electrode-side busbar 81 in the present embodiment has a main wall portion 90 and an outer peripheral wall portion 91.

The main wall portion 90 is formed to spread in a fan shape in the circumferential direction along the upper surface of each power module 70. A through hole 92 is formed at a part of the main wall portion 90 corresponding to the output terminal 71 of each power module 70. The outer peripheral wall portion 91 is continuous with the outer peripheral edge of the arc shape of the main wall portion 90 to be bent in a direction orthogonal thereto and extends along the outer end portion 76 of each power module 70.

Similarly to the inner edge portion 80a of the negative-electrode-side busbar 80, the inner edge portion 81a of the positive-electrode-side busbar 81 in the present embodiment has an arc shape extending in the circumferential direction. Accordingly, the inner edge portion 81a of the positive-electrode-side busbar 81 in the present embodiment is joined, in a state of being fitted to the alternating-current-side side surface portion 61 of the smoothing capacitor 60, to the alternating-current-side terminal 62 of the positive side. The outer edge portion 81b (the terminal end part of the outer peripheral wall portion 91) of the positive-electrode-side busbar 81 in the present embodiment is joined, in a state of being fitted to the outer end portion 76 of each of the power modules 70, to the positive electrode terminal 72.

The negative-electrode-side busbar 80 and the positive-electrode-side busbar 81 in the present embodiment differ from each other in length. Therefore, the lengths and the widths of the negative-electrode-side busbar 80 and the positive-electrode-side busbar 81 are adjusted such that the inductances thereof are substantially the same. That is, the length L (−) of the negative-electrode-side busbar 80 and the length (the total value of La (+) and Lb (+)) of the positive-electrode-side busbar 81 are adjusted together with these widths. Consequently, the inductances of these busbars 80 and 81 are equalized. As a result, it is possible to suppress deterioration in the controllability of the motor 20.

In a state of being joined to the output terminals 71 of respective power modules 70, each of the output-side busbars 82 is drawn upward to above the positive-electrode-side busbar 81 through the through hole 92. The output-side busbars 82 and the positive-electrode-side busbar 81 are insulated from each other by a resin sheet 93. The output-side busbars 82 and the positive-electrode-side busbar 81 are each formed in a shape that is bent to have an L-shaped cross-section so as to extend along the upper surface of each power module 70.

After extending radially outward as it is, each of the output-side busbars 82 extends in the rotational axis direction toward the motor 20 and is thereby connected to the relay terminal 28 corresponding thereto. The length of each of the output-side busbars 82 is also designed such that the wiring lengths are the same. Therefore, the inductances of the output-side busbars 82 are also the same.

Even when the shapes, the arrangement, and the like of the power modules 70 and the busbars 80, 81, and 82 are configured as in the present embodiment, the same effects as those in the above-described embodiments can be obtained.

Fourth Embodiment

Figure 16:
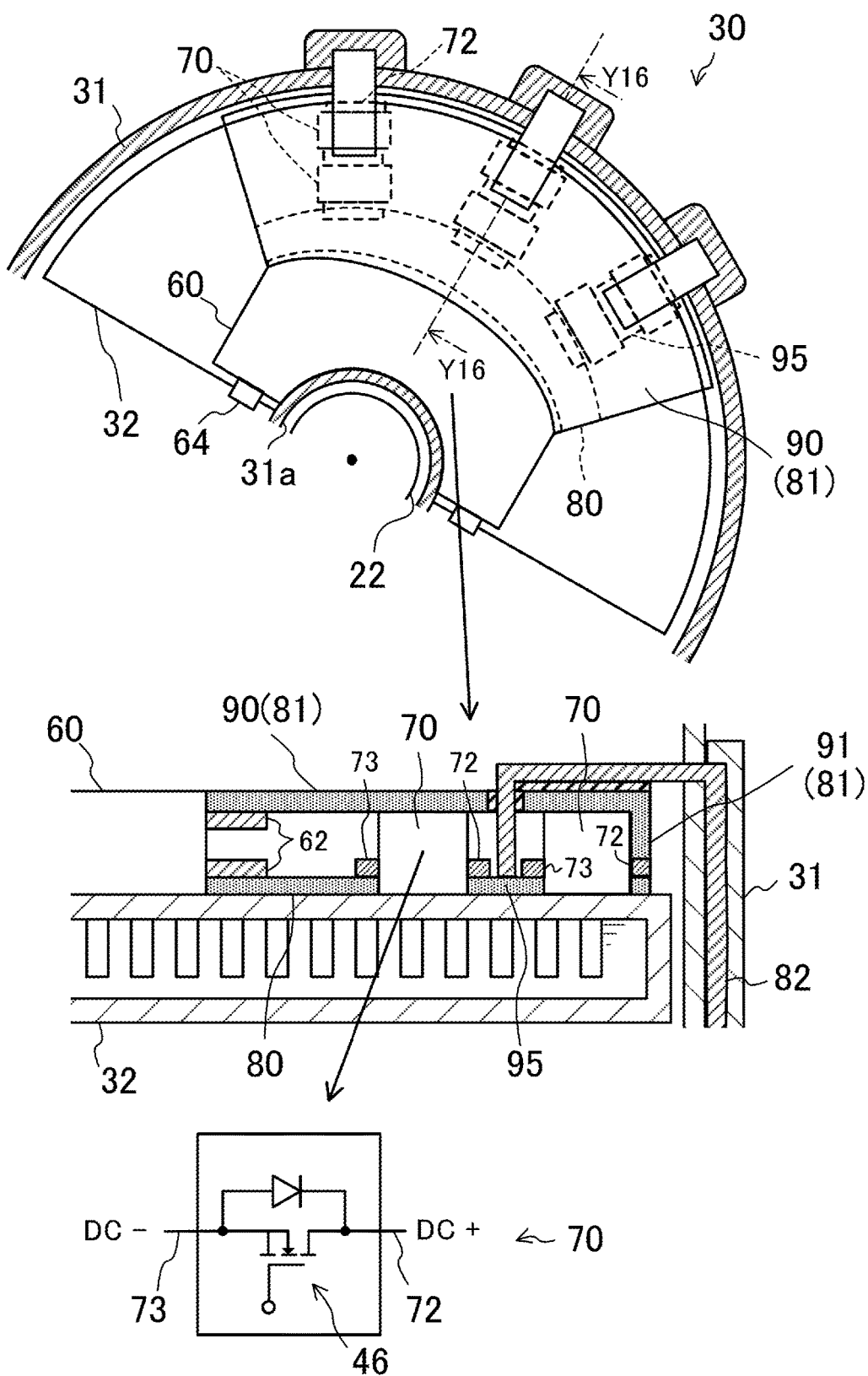
FIG. 16 is a view for describing an electric drive unit according to a fourth embodiment.

FIG. 16 illustrates a fourth embodiment of the disclosed electric drive unit and includes a schematic sectional view taken along an arrow Y16. The basic configuration of the present embodiment is the same as that of the third embodiment. As simply illustrated in FIG. 16, each of the power modules 70 is constituted by one switching element 46 in the present embodiment while, in the third embodiment, the half bridge circuits 45 of the respective phases are constituted by the power modules 70 each including two switching elements 46.

These two power modules 70 are connected in series by using a relay busbar 95. Consequently, the half bridge circuit 45 is constituted. The output-side busbar 82 is joined to the relay busbar 95. Similarly to the third embodiment, the lengths and the widths of the negative-electrode-side busbar 80 and the positive-electrode-side busbar 81 are adjusted also in the present embodiment such that inductance is substantially the same therebetween. The length of each output-side busbar 82 is also designed such that inductance is the same.

Even when the shapes, the arrangement, and the like of the power modules 70 and the busbars 80, 81, 82, and 95 are configured as in the present embodiment, the same effects as those in the above-described embodiments can be obtained.

Fifth Embodiment

Figure 17:
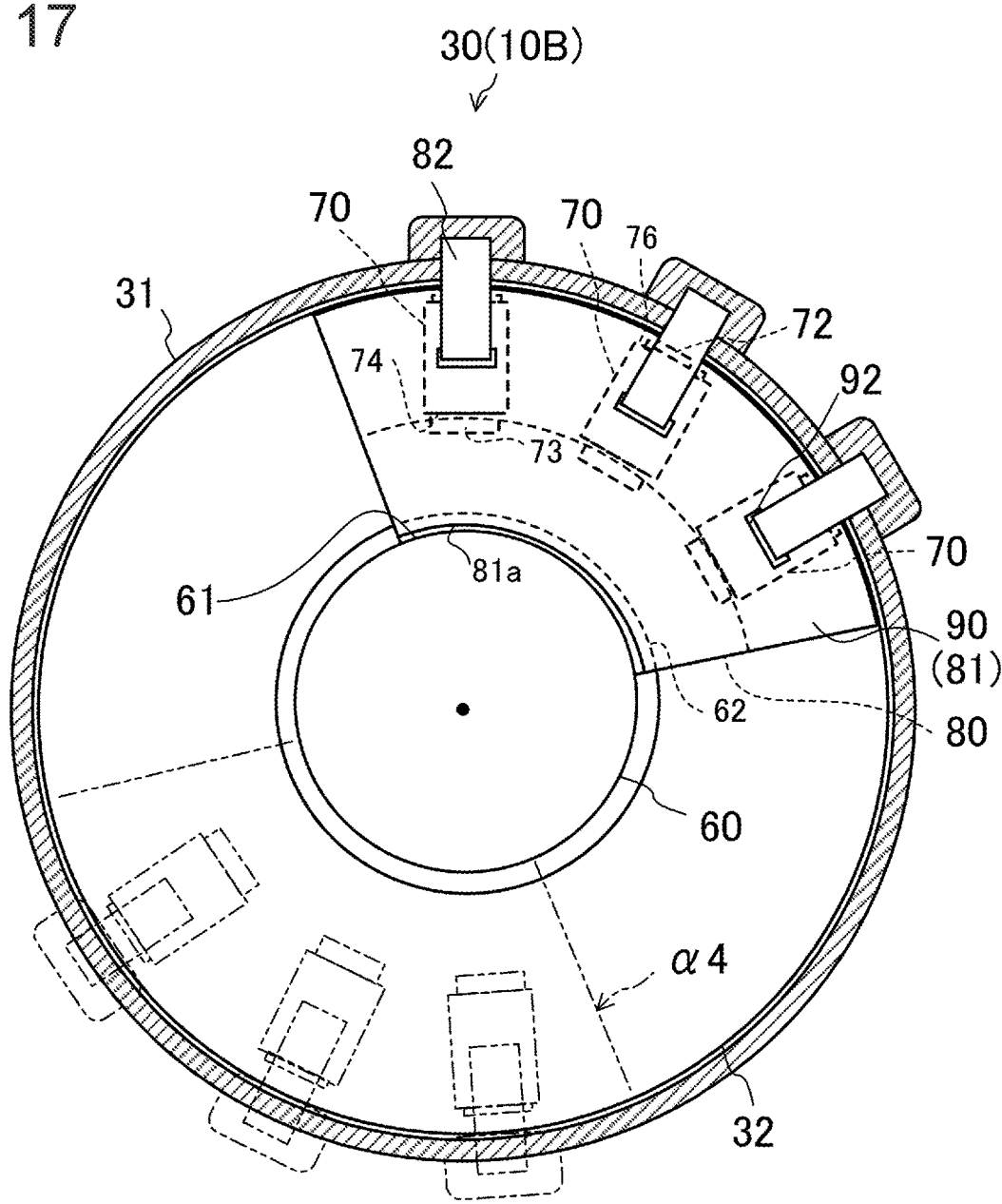
FIG. 17 is a view corresponding to FIG. 7 and illustrating an electric drive unit according to a fifth embodiment.

FIG. 17 illustrates a fifth embodiment of the disclosed electric drive unit. The present embodiment is an embodiment corresponding to the second electric drive unit 10B.

That is, in the second electric drive unit 10B, the second inverter 30 is integrated with the in-wheel motor 20B, and it is thus not essential to insert the shaft 24 into a center portion of the thin case 31. Accordingly, in the thin case 31 of the present embodiment, the shaft cylinder portion 31a is not provided at a center portion as in each embodiment described above. Consequently, the space at the center portion of the thin case 31 is expanded.

Thus, by utilizing the space, the smoothing capacitor 60 in the present embodiment is formed in a disk shape coaxial with the thin case 31. Accordingly, the capacity of the smoothing capacitor 60 can be increased. When the capacity is the same, the thickness can be reduced. In addition, since the length from the center of the thin case 31 to the alternating-current-side side surface portion 61 is the same, it is sufficient to dispose the power modules 70 in point-symmetrically, and the layout design of electronic components is easy.

The shapes and the arrangement of each power module 70, the positive-electrode-side busbar 81, the negative-electrode-side busbar 80, and the output-side busbars 82 presented in the present embodiment are the same as those in the third embodiment illustrated in FIG. 13. Alternatively, the shapes and the arrangement such as those in the other embodiments may be employed.

Even when the shapes, the arrangement, and the like of the power modules 70 and the busbars 80, 81, and 82 are configured as in the present embodiment, the same effects as those in the above-described embodiments can be obtained.

Other Embodiments

The disclosed technology is not limited to the embodiments described above. The disclosed technology includes also various configurations other than those.

For example, in each embodiment described above, the inverter 30 in which each of the power modules 70 and the busbars 80, 81, and 82 is disposed at a portion in the circumferential direction at the outer peripheral side of the thin case 31 is presented as an example.

However, the example is a non-limiting example. It may be configured such that, as indicated by an imaginary line α4 in the fifth embodiment illustrated in FIG. 17, the power modules 70 are disposed over any part at the whole circumference of the thin case 31, the smoothing capacitor 60 is extended accordingly in the circumferential direction, and the busbars 80, 81, and 82 are formed over the whole circumference, for example, in an annular form. In this case, a larger number of the power modules 70 can be installed. It is thus possible to achieve an inverter compatible with a motor of multiple phases or a high-output inverter.

The inverter 30 reduced in the thickness and the weight by the disclosed technology is preferably disposed adjacent to one end of the motor 20 in the rotational axis direction. Such an arrangement is, however, not essential. Depending on vehicle specifications, the inverter 30 may be disposed in the vicinity of the motor 20, for example, at a side of or above the motor 20.

What is claimed is:

1. An electric drive unit including a motor and an inverter disposed adjacent to one end of the motor in a rotational axis direction,
    wherein the inverter includes:
        a plurality of power modules each of which includes at least one switching element, the plurality of power modules constituting an inverter circuit configured to convert direct-current power into alternating-current power;
        a smoothing capacitor that constitutes, together with the plurality of power modules, the inverter circuit;
        a busbar that connects each of the power modules to the smoothing capacitor; and
        a thin case that has a thickness of less than 50 mm in the rotational axis direction and that accommodates the power modules, the smoothing capacitor, and the busbar,
    wherein the plurality of power modules are disposed at a periphery of the smoothing capacitor and arranged in a circumferential direction, and the busbar is formed to extend in the circumferential direction, and
    wherein an inner edge portion of the busbar connected to a terminal of the smoothing capacitor has an arc shape or a circular shape extending in the circumferential direction.

2. The electric drive unit according to claim 1,
    wherein the thin case has an outer shape formed in a disk shape corresponding to the motor.

3. The electric drive unit according to claim 2,
    wherein each of the power modules includes a positive electrode terminal and a negative electrode terminal, a half bridge circuit, and an output terminal, the at least one switching element being two switching elements, the half bridge circuit being connected between the positive electrode terminal and the negative electrode terminal in a state in which the two switching elements are connected in series, the output terminal being connected between the two switching elements.

4. The electric drive unit according to claim 3,
    wherein the switching element is constituted by a silicon carbide metal oxide semiconductor field effect transistor.

5. The electric drive unit according to claim 3,
    wherein the smoothing capacitor is constituted by a plurality of element capacitors connected in parallel, and
    wherein the plurality of element capacitors that are arranged to face the plurality of power modules are disposed along an arrangement of the plurality of power modules.

6. The electric drive unit according to claim 2,
    wherein the switching element is constituted by a silicon carbide metal oxide semiconductor field effect transistor.

7. The electric drive unit according to claim 2,
    wherein the smoothing capacitor is constituted by a plurality of element capacitors connected in parallel, and
    wherein the plurality of element capacitors that are arranged to face the plurality of power modules are disposed along an arrangement of the plurality of power modules.

8. The electric drive unit according to claim 1,
    wherein the smoothing capacitor and the power modules each have a flat shape having an installation surface at one side and are placed on a common support surface via the installation surface.

9. The electric drive unit according to claim 8,
    wherein the busbar includes a third busbar that has a plate shape extending in a fan shape along an upper surface of each of the power modules, and
    wherein the third busbar is connected to one of a positive electrode terminal and a negative electrode terminal of each of the power modules and to a corresponding terminal of the smoothing capacitor.

10. The electric drive unit according to claim 9,
    wherein the busbar further includes a first busbar that has a plate shape extending in a band shape between and along each of the power modules and the smoothing capacitor and that is connected to another of the positive electrode terminal and the negative electrode terminal of each of the power modules and to a corresponding terminal of the smoothing capacitor.

11. The electric drive unit according to claim 10,
    wherein each of the power modules includes the positive electrode terminal and the negative electrode terminal, a half bridge circuit, and an output terminal, the at least one switching element being two switching elements, the half bridge circuit being connected between the positive electrode terminal and the negative electrode terminal in a state in which the two switching elements are connected in series, the output terminal being connected between the two switching elements.

12. The electric drive unit according to claim 11,
    wherein the switching element is constituted by a silicon carbide metal oxide semiconductor field effect transistor.

13. The electric drive unit according to claim 12,
    wherein the smoothing capacitor is constituted by a plurality of element capacitors connected in parallel, and
    wherein the plurality of element capacitors that are arranged to face the plurality of power modules are disposed along an arrangement of the plurality of power modules.

14. The electric drive unit according to claim 1,
    wherein each of the power modules includes a positive electrode terminal and a negative electrode terminal, a half bridge circuit, and an output terminal, the at least one switching element being two switching elements, the half bridge circuit being connected between the positive electrode terminal and the negative electrode terminal in a state in which the two switching elements are connected in series, the output terminal being connected between the two switching elements.

15. The electric drive unit according to claim 14,
wherein the switching element is constituted by a silicon carbide metal oxide semiconductor field effect transistor.

16. The electric drive unit according to claim 15,
wherein the smoothing capacitor is constituted by a plurality of element capacitors connected in parallel, and
wherein the plurality of element capacitors that are arranged to face the plurality of power modules are disposed along an arrangement of the plurality of power modules.

17. The electric drive unit according to claim 14,
wherein the smoothing capacitor is constituted by a plurality of element capacitors connected in parallel, and
wherein the plurality of element capacitors that are arranged to face the plurality of power modules are disposed along an arrangement of the plurality of power modules.

18. The electric drive unit according to claim 1,
wherein the switching element is constituted by a silicon carbide metal oxide semiconductor field effect transistor.

19. The electric drive unit according to claim 18,
wherein the smoothing capacitor is constituted by a plurality of element capacitors connected in parallel, and
wherein the plurality of element capacitors that are arranged to face the plurality of power modules are disposed along an arrangement of the plurality of power modules.

20. The electric drive unit according to claim 1,
wherein the smoothing capacitor is constituted by a plurality of element capacitors connected in parallel, and
wherein the plurality of element capacitors that are arranged to face the plurality of power modules are disposed along an arrangement of the plurality of power modules.

* * * * *